US012764423B2

(12) United States Patent
Lee

(10) Patent No.: US 12,764,423 B2
(45) Date of Patent: Oct. 13, 2026

(54) IMAGE SENSORS AND IMAGE PROCESSING DEVICES THAT SUPPORT ROLLING AND GLOBAL SHUTTER MODES OF OPERATION

(71) Applicant: Samsung Electronics Co., Ltd., Suwon-si (KR)

(72) Inventor: Jaekyu Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 154 days.

(21) Appl. No.: 18/782,093

(22) Filed: Jul. 24, 2024

(65) Prior Publication Data

US 2025/0071428 A1 Feb. 27, 2025

(30) Foreign Application Priority Data

Aug. 21, 2023 (KR) ........................ 10-2023-0109342

(51) Int. Cl.
*H04N 23/73* (2023.01)
*H04N 25/531* (2023.01)
(Continued)

(52) U.S. Cl.
CPC ........... *H04N 23/73* (2023.01); *H04N 25/531* (2023.01); *H04N 25/532* (2023.01); *H10F 39/18* (2025.01); *H10F 39/8037* (2025.01)

(58) Field of Classification Search
CPC .... H04N 23/73; H04N 25/531; H04N 25/532; H04N 25/46; H04N 25/59; H04N 25/616;
(Continued)

(56) References Cited

U.S. PATENT DOCUMENTS 7,573,013 B2 8/2009 Choi et al.
8,797,434 B2 8/2014 Lee et al.
(Continued)

FOREIGN PATENT DOCUMENTS

CN 115396615 A 11/2022
EP 4344243 A1 3/2024

OTHER PUBLICATIONS

Extended European Search Report corresponding to European Application No. 24194226.7 (12 pages) (Oct. 31, 2024).

*Primary Examiner* — Lin Ye
*Assistant Examiner* — Tuan H Le
(74) *Attorney, Agent, or Firm* — Wolf, Greenfield & Sacks, P.C.

(57) ABSTRACT

An image sensor pixel includes: first and second sub-pixels, which are electrically coupled to first and second floating diffusion nodes of the pixel, respectively; a first rolling shutter operation circuit configured to read out photocharges that are collected in the first floating diffusion node during a rolling shutter mode of operation; a second rolling shutter operation circuit configured to read out photocharges that are collected in the second floating diffusion node during the rolling shutter mode of operation; a global select switch circuit electrically coupled to the first and second rolling shutter operation circuits; and a global shutter operation circuit electrically coupled to the global select switch circuit. The global shutter operation circuit is configured to read out photocharges that are: (i) collected in the first and second floating diffusion nodes, and (ii) pass through the global select switch circuit during a global shutter mode of operation.

20 Claims, 19 Drawing Sheets

(51) Int. Cl.
*H04N 25/532* (2023.01)
*H10F 39/00* (2025.01)
*H10F 39/18* (2025.01)

(58) Field of Classification Search
CPC .... H04N 25/771; H04N 25/778; H04N 25/78; H04N 25/53; H04N 25/79; H10F 39/18; H10F 39/8037
See application file for complete search history.

(56) References Cited

U.S. PATENT DOCUMENTS

| | | | | |
|---|---|---|---|---|
| 10,002,901 | B1 | 6/2018 | Xu et al. | |
| 2015/0350583 | A1* | 12/2015 | Mauritzson | H04N 25/134 257/432 |
| 2020/0358971 | A1* | 11/2020 | Shim | H04N 25/42 |
| 2021/0235027 | A1 | 7/2021 | Meynants | |
| 2022/0246650 | A1* | 8/2022 | Jang | G01S 7/4816 |
| 2022/0321759 | A1* | 10/2022 | Miyauchi | H04N 25/583 |
| 2023/0007192 | A1 | 1/2023 | Lee | |
| 2024/0381002 | A1* | 11/2024 | Gao | H04N 25/78 |

* cited by examiner

IMAGE SENSORS AND IMAGE PROCESSING DEVICES THAT SUPPORT ROLLING AND GLOBAL SHUTTER MODES OF OPERATION

REFERENCE TO PRIORITY APPLICATION

This application claims priority under 35 U.S.C. § 119 to Korean Patent Application No. 10-2023-0109342, filed Aug. 21, 2023, the disclosure of which is hereby incorporated herein by reference.

BACKGROUND

The inventive concept relates to image processing devices and, more particularly, to integrated circuit image sensors and image processing devices using the same.

An image sensor that captures and converts images into electrical signals is used not only in consumer electronic devices such as digital cameras, mobile phone cameras, and portable camcorders, but also in cameras mounted on automobiles, security devices, and robots, for example.

As will be understood by those skilled in the art, an image sensor may adjust exposure time to determine an amount of accumulated photocharge, which is the basis of electrical signals generated by the image sensor. Some image sensor may adjust exposure time using rolling shutters and global shutters. A rolling shutter is a method of controlling the integration time of photocharges differently for each row of a pixel array, whereas a global shutter is a method of controlling the integration time of photocharges equally for different rows of the pixel array.

SUMMARY

The inventive concept provides an image sensor capable of outputting adjacent pixels during a rolling shutter mode of operation, and outputting the adjacent pixels during a global shutter mode of operation.

According to an embodiment of the inventive concept, an image sensor is provided, which includes a plurality of image sensor pixels arranged into a two-dimensional array. Each image sensor pixel may include: a first sub-pixel electrically coupled to a first floating diffusion node of the pixel; a second sub-pixel electrically coupled to a second floating diffusion node of the pixel; a first rolling shutter operation circuit configured to read out photocharges integrated in the first floating diffusion node during a rolling shutter mode of operation; a second rolling shutter operation circuit configured to read out photocharges integrated in the second floating diffusion node during the rolling shutter mode of operation; a global select switch circuit electrically coupled to the first and second rolling shutter operation circuits; and a global shutter operation circuit electrically coupled to the global select switch circuit, and configured to read out photocharges integrated in the first and second floating diffusion nodes during a global shutter mode of operation.

According to another embodiment of the inventive concept, an image sensor includes: a first sub-pixel including at least two first photodiodes; a second sub-pixel including at least two second photodiodes; a first floating diffusion node configured to store charge integrated by the first photodiodes; a second floating diffusion node configured to store charge integrated by the second photodiodes; a first source follower transistor configured to amplify a voltage stored in the first floating diffusion node; a second source follower transistor configured to amplify a voltage stored in the second floating diffusion node; a first rolling select transistor connected in series with the first source follower transistor; a second rolling select transistor connected in series with the second source follower transistor; and a global select switch connected between an output terminal of the first source follower transistor and an output terminal of the second source follower transistor.

According to a further embodiment of the inventive concept, an image processing device is provided, which includes: an image sensor including a pixel array in which a plurality of pixels are arranged in a matrix, and configured to generate image data based on optical signals received by the pixel array; and an application processor configured to receive and process the image data from the image sensor and provide a mode setting signal to the image sensor. In some of these embodiments, each of the plurality of pixels is configured to include: a first sub-pixel sharing a first floating diffusion node; a second sub-pixel sharing a second floating diffusion node; a first rolling shutter operation circuit configured to read out photocharge integrated in the first floating diffusion node during a rolling shutter mode of operation; a second rolling shutter operation circuit configured to read out photocharge integrated in the second floating diffusion node during the rolling shutter mode of operation; a global select switch circuit electrically coupled between the first rolling shutter operation circuit and the second rolling shutter operation circuit (and including at least one transistor); and a global shutter operation circuit electrically coupled to the global select switch circuit, and configured to read out photocharge integrated in the first floating diffusion node and the second floating diffusion node during a global shutter mode of operation.

According to another embodiment of the inventive concept, an image sensor pixel is provided, which includes first and second sub-pixels electrically coupled to first and second floating diffusion nodes of the pixel, respectively, and a shutter operation circuit. The shutter operation circuit is configured to: (i) read out photocharges collected in the first and second floating diffusion nodes to respective first and second output lines during a rolling during a rolling shutter mode of operation, and (ii) read out photocharges collected in the first and second floating diffusion nodes to a third output line during a global shutter mode of operation.

BRIEF DESCRIPTION OF THE DRAWINGS

Embodiments will be more clearly understood from the following detailed description taken in conjunction with the accompanying drawings in which.

DETAILED DESCRIPTION OF EMBODIMENTS

Hereinafter, various embodiments are described with reference to the attached drawings.

Figure 1:
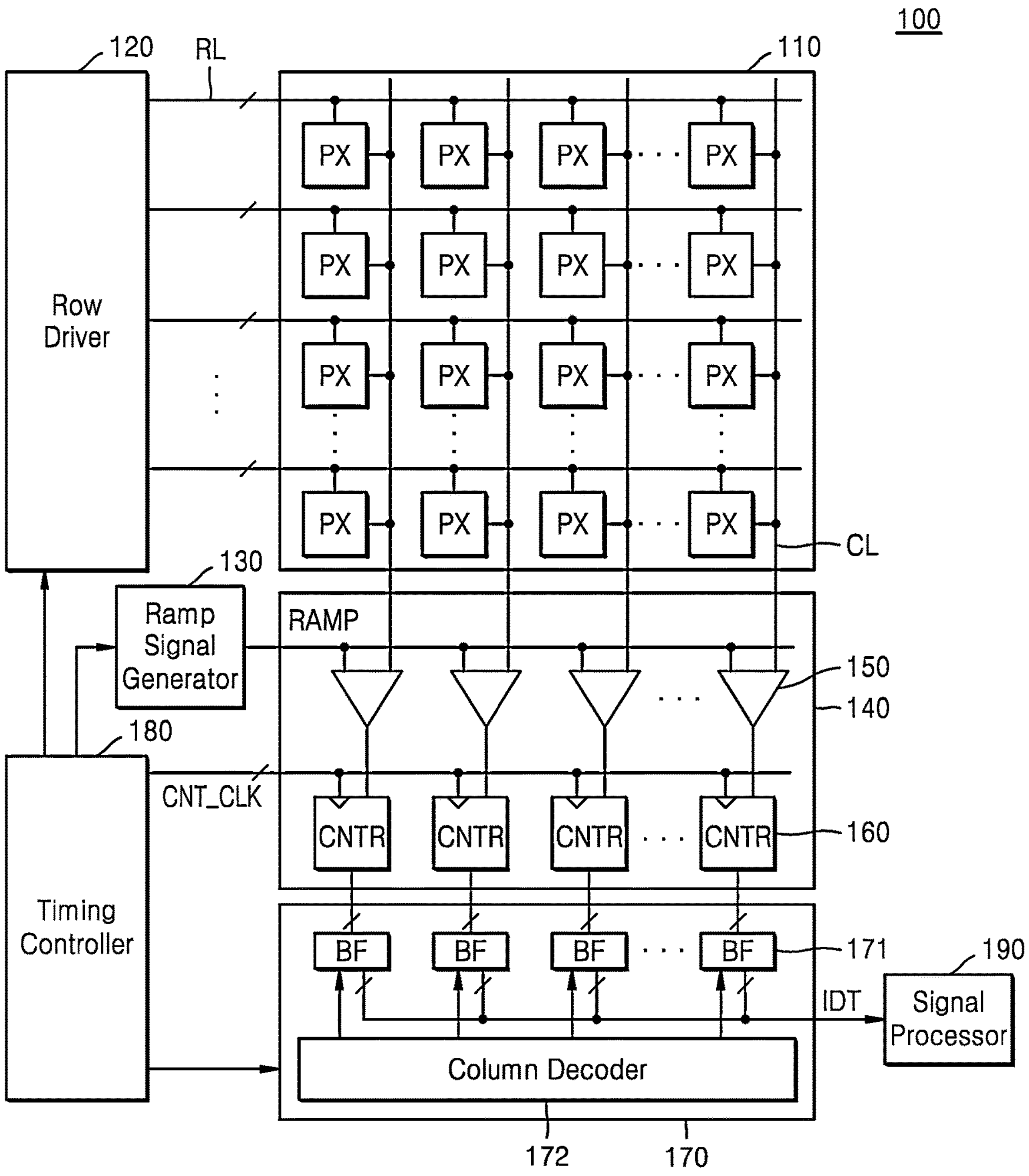
FIG. 1 is a block diagram of an image sensor according to an embodiment.

FIG. 1 is a block diagram of an image sensor according to an embodiment. As will be understood by those skilled in the art, an image sensor 100 may be mounted on electronic devices having an image- or light-sensing function. For example, the image sensor 100 may be mounted on electronic devices such as cameras, smartphones, wearable devices, Internet of Things (IoT) devices, home appliances, tablet personal computers (PCs), personal digital assistants (PDAs), portable multimedia players (PMPs), navigation systems, drones, and advanced driver assistance systems (ADAS). Additionally, the image sensor 100 may be mounted on electronic devices that are included as components in vehicles, furniture, manufacturing facilities, doors, and various measuring devices.

Referring to FIG. 1, the image sensor 100 may include a pixel array 110, a row driver 120, a ramp signal generator 130, an analog-to-digital conversion (ADC) circuit 140, a data output circuit 170, and a timing controller 180. The image sensor 100 may further include a signal processor 190. A configuration including the ramp signal generator 130, the ADC circuit 140, and the data output circuit 170 may be referred to as a readout circuit.

As shown, the pixel array 110 may include a plurality of row lines RL, a plurality of column lines CL, and a plurality of pixels PX, which are connected to the plurality of row lines RL and the plurality of column lines CL, and are arranged in rows and columns as a two-dimensional array. Each of the plurality of pixels PX may include a plurality of photoelectric conversion elements, and may detect light using the photoelectric conversion elements and output an image signal, which is an electrical signal according to the detected light. For example, the photoelectric conversion elements may include a photodiode, a phototransistor, a photogate, a pinned photodiode, and the like.

Each of the plurality of pixels PX may detect light in a specific spectral range. For example, the plurality of pixels PX may include a red pixel for converting light in a red spectral range into an electrical signal, a green pixel for converting light in a green spectral range into an electrical signal, and a blue pixel for converting light in a blue spectral range into an electrical signal. However, the inventive concept is not limited thereto, and the plurality of pixels PX may further include a white pixel. As another example, the plurality of pixels PX may include pixels combined with different color configurations, such as a yellow pixel, a cyan pixel, and a magenta pixel.

A color filter array may be placed on top of the plurality of pixels PX to transmit light in a specific spectral range, and the color detected by the corresponding pixel may be determined according to a color filter placed on top of each of the plurality of pixels. However, the inventive concept is not limited thereto. In some embodiments, specific photoelectric conversion elements may convert light in a specific wavelength band into an electrical signal depending on the level of the electrical signal applied to the photoelectric conversion elements.

In an embodiment, each of the plurality of pixels PX may have a pixel structure that supports both a global shutter mode of operation and a rolling shutter mode of operation; similarly, the pixel array 110 may operate in the global and rolling shutter modes of operation. As described more fully hereinbelow, during the global shutter mode of operation, the plurality of pixels PX of the pixel array 110 have the same exposure start point and the same exposure period, and then a plurality of rows of the pixel array 110 are sequentially read after the exposure period. In contrast, during the rolling shutter mode of operation, the plurality of rows of the pixel array 110 are exposed sequentially and read sequentially.

In some embodiments, each of the plurality of pixels PX may have a dual conversion gain, which includes a low conversion gain and a high conversion gain. The conversion gain refers to a rate at which charge integrated in floating diffusion nodes (FD1 and FD2 in FIG. 4) is converted into voltage. The charge generated from the photoelectric conversion elements may be transferred to the floating diffusion nodes and integrated therein, and the charge integrated in the floating diffusion nodes may be converted into voltage according to the conversion gain. In some embodiments, the conversion gain may vary depending on the capacitance of the floating diffusion nodes. As the capacitance of the floating diffusion nodes increases, the conversion gain may decrease, and as the capacitance of the floating diffusion nodes decreases, the conversion gain may increase; thus, an inverse relationship may exist between the magnitude of capacitance and the conversion gain.

In an embodiment, each of the plurality of pixels PX may include at least two photodiodes, and the image sensor 100 may provide autofocus (AF) based on pixel signals corresponding to photocharge output from the at least two photodiodes. In addition, each pixel PX according to the inventive concept may include a plurality of sub-pixels, and each sub-pixel may be connected to corresponding floating diffusion nodes. The pixel PX may simultaneously output the results of each of the plurality of sub-pixels operating in rolling shutter mode, or may operate in global shutter mode and output the results of binning the plurality of sub-pixels to separate output lines. As will be understood by those skilled in the art, pixel "binning" is associated with a process of combining adjacent sub-pixels throughout a captured image using, for example, summing or averaging of their values during or after a readout. The pixel structure of the plurality of pixels PX according to an embodiment of the inventive concept is described in detail with reference to FIG. 3 below.

The row driver 120 drives the pixel array 110 row-by-row. The row driver 120 may decode a row control signal (e.g., an address signal) received from the timing controller 180 and may select at least one row line from among row lines constituting the pixel array 110 in response to the decoded row control signal. For example, the row driver 120 may generate a select signal to select one row from among the plurality of rows of the pixel array 110. The pixel array 110 may output pixel signals, for example, pixel voltage, from the row selected by the select signal provided from the row driver 120. The pixel signals may include a reset signal and an image signal. The row driver 120 may transmit control signals for outputting the pixel signals to the pixel array 110, and the pixels PX may operate in response to the control signals, thereby outputting the pixel signals.

The ramp signal generator 130 may generate a ramp signal RAMP (e.g., ramp voltage) having a level that rises or falls at a certain slope under the control by the timing controller 180. The ramp signal RAMP may be provided to each of a plurality of correlated double sampling (CDS) circuits 150 provided in the ADC circuit 140. As shown, the ADC circuit 140 may include the plurality of CDS circuits 150 and a plurality of counters 160. The ADC circuit 140 may convert the pixel signal (e.g., pixel voltage) input from the pixel array 110 into a pixel value, which is a digital signal. Each pixel signal received through each of the plurality of column lines CL may be converted into a pixel value, which is a digital signal, by the CDS circuits 150 and the counters 160.

The CDS circuits 150 may compare the pixel signal, for example, pixel voltage, received through the column line CL with the ramp signal RAMP and may output the comparison result as a comparison signal. When the level of the ramp signal RAMP is the same as the level of the pixel signal, the CDS circuits 150 may output the comparison signal that transitions from a first level (e.g., logic high) to a second level (e.g., logic low). The point at which the level of the comparison signal transitions may be determined according to the level of the pixel signal. Hereinafter, for convenience of explanation in the inventive concept, the first level is indicated as a high level and the second level is indicated as a low level.

The CDS circuits 150 may sample the pixel signal provided from the pixel PX according to CDS. The CDS circuits 150 may sample the reset signal received as the pixel signal and compare the reset signal with the ramp signal RAMP to generate the comparison signal according to the reset signal. The CDS circuits 150 may sample the image signal correlated to the reset signal and compare the image signal with the ramp signal RAMP to generate the comparison signal according to the image signal.

The counters 160 may count the level transitions point at which the comparison signal output from the CDS circuits 150 based on a counting clock CNT_CLK provided from the timing controller 180 and may output a count value. In some embodiments, the counters 160 may be implemented as an up-counter and an operation circuit of which the count value sequentially increases based on the counting clock CNT_CLK, or an up/down counter, or a bitwise inversion counter.

In some embodiments, the image sensor 100 may further include a counting code generator that generates a counting code (e.g., gray code) of which the value changes periodically and provides the counting code to each of the plurality of counters 160, wherein the counters 600 may each include a latch circuit and an operation circuit. The latch circuit may latch the code value of the counting code at the point at which the level of the comparison signal transitions. The latch circuit may latch each of a code value corresponding to the reset signal, such as a reset value, and a code value corresponding to the image signal, such as an image signal value. The operation circuit may calculate the reset value and the image signal value to generate an image signal value from which the reset level of the pixel PX has been removed. The counters 160 may output the image signal value, from which the reset level has been removed, as a pixel value.

The data output circuit 170 may temporarily store and then output the pixel value output from the ADC circuit 140. The data output circuit 170 may include a plurality of column memories 171 (or referred to as buffers BF) and a column decoder 172. The column memories 171 store pixel values received from the counters 160 corresponding to the column memories 171. In some embodiments, the plurality of column memories 171 may be provided in the counters 160, respectively. The plurality of pixel values stored in the plurality of column memories 171 may be output as image data IDTA under the control by the column decoder 172.

The timing controller 180 may output a control signal to each of the row driver 120, the ramp signal generator 130, the ADC circuit 140, and the data output circuit 170 and may control the operation or timing of the row driver 120, the ramp signal generator 130, the ADC circuit 140, and the data output circuit 170.

The signal processor 190 may perform noise reduction processing, gain adjustment, waveform normalization processing, interpolation processing, white balance processing, gamma processing, edge emphasis processing, binning, and the like on the image data IDTA. In some embodiments, the signal processor 190 may be provided in an external processor located outside the image sensor 100.

Figure 2A:
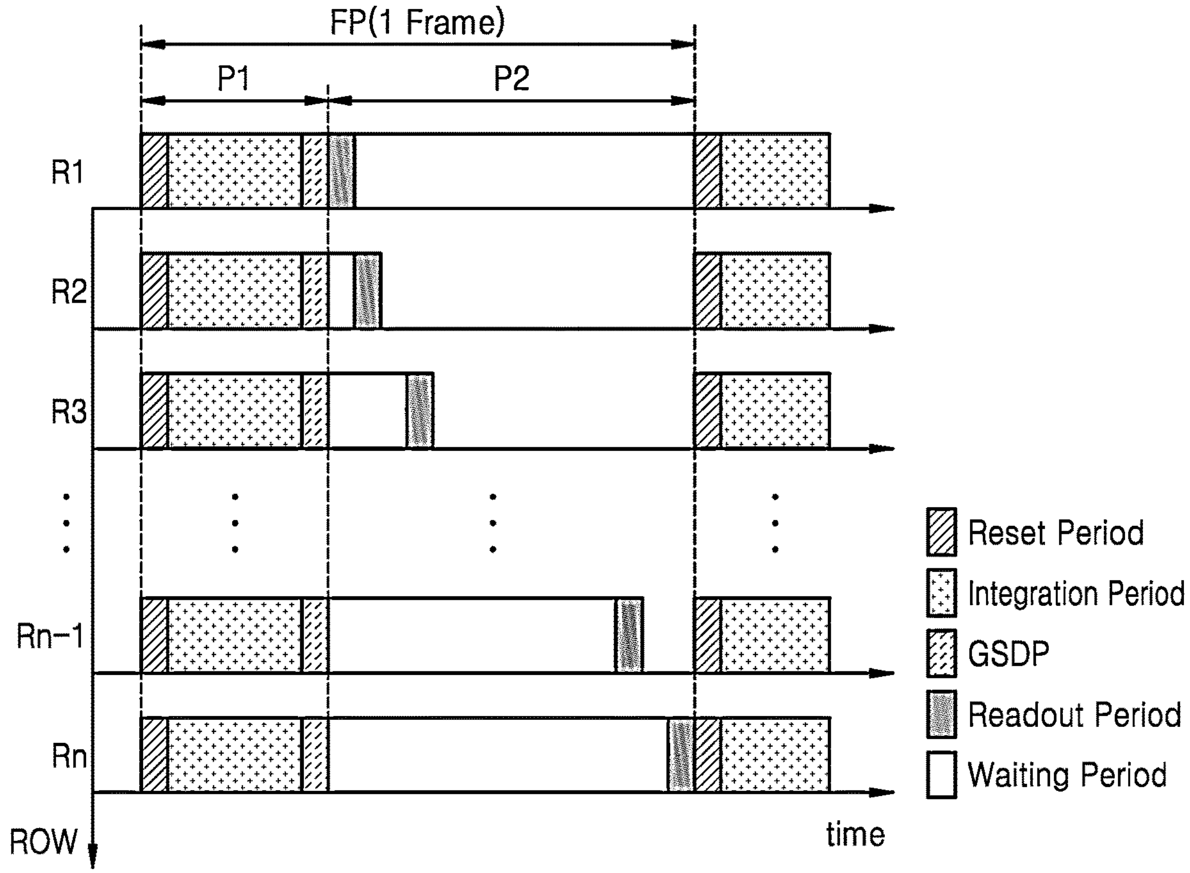
FIGS. 2A and 2B are timing diagrams showing operations that can occur during global shutter and rolling shutter modes of operation.
Figure 2B:
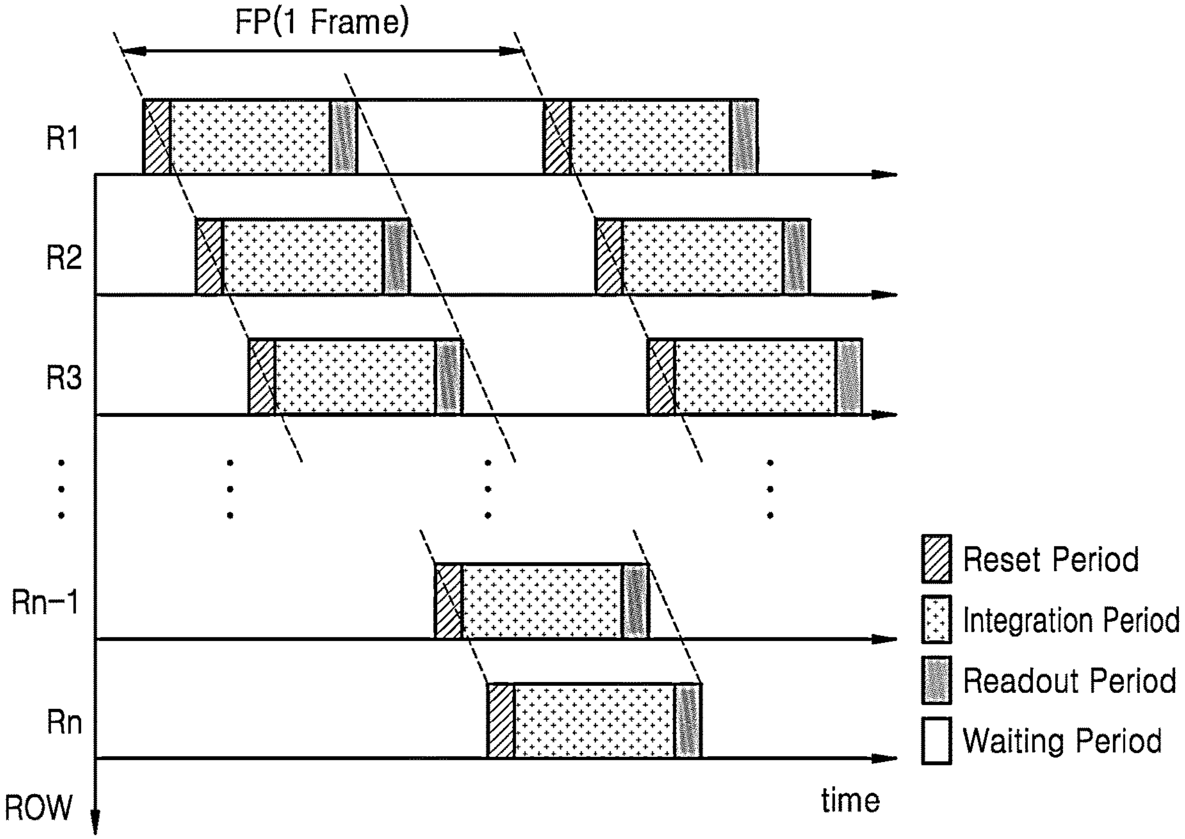

FIGS. 2A and 2B are timing diagrams showing operations performed by the image sensor 100 during the global shutter mode of operation and the rolling shutter mode of operation. Referring to FIGS. 1 and 2A, the image sensor 100 may operate in global shutter mode. As shown, one frame period FP may include a first period P1 (i.e., global image capture) and a second period P2. As shown, during the first period P1, the plurality of pixels PX of the pixel array 110, that is, the plurality of rows of the pixel array 110 (e.g., first row R1 to $n^{th}$ row Rn), may simultaneously perform a reset operation, an exposure operation, and a global signal dumping operation, and then in the second period P2, the plurality of rows of the pixel array 110 may sequentially perform a read operation. The second period P2 may be referred to as a frame readout period.

The first period P1 may include a reset period, an integration period, and a global signal dumping period (GSDP). The plurality of pixels PX may perform a reset operation to remove charge integrated in the photodiodes (and floating diffusion nodes) during the reset period, may perform an integration operation in which generate and integrate photocharge corresponding to a received optical signal by the photodiodes during the integration period, and may store the reset signal according to the reset level of the floating diffusion nodes and the image signal corresponding to the photocharge integrated in the photodiodes, respectively, in at least two capacitors provided therein, during the GSDP.

Then, during the second period P2, a rolling readout operation in which a readout operation performed during the readout period is sequentially performed for each row may be performed. For example, after the readout operation is performed on the first row R1 of the pixel array 110, the readout operation may be performed on the next second row R2. After the readout operation for the second row R2 is performed, the readout operation for the third row R3, which is next in order, may be performed. During the readout operation, the reset signal and the image signal respectively stored in the at least two capacitors during the GSDP may be output from each pixel PX as pixel signals.

Referring now to FIGS. 1 and 2B, the image sensor 100 may operate in a rolling shutter mode of operation. Here, in one frame period FP, the plurality of rows (e.g., first row R1 to $n^{th}$ row Rn) of the pixel array 110 may sequentially perform the reset operation, the exposure operation, and the readout operation. One row of pixels PX may perform the reset operation during the reset period and the integration operation during the integration period and may output as pixel signals the reset signal (e.g., reset voltage) corresponding to the reset level of the floating diffusion nodes during the readout period and the image signal (e.g., image voltage) corresponding to the photocharge generated in the photodiodes. The readout periods of the plurality of rows of the pixel array 110 do not overlap. After the readout period, one row of pixels PX may perform the reset operation again after a waiting period. In an embodiment, the waiting period may be set so that the readout period in the next frame period of at least one row (e.g., the first row R1, the second row R2, etc.) that is initially read out during the frame period FP does not overlap the readout period in the current frame period of at least one other row (e.g., $n-1^{th}$ row Rn−1, $n^{th}$ row Rn, etc.) that is read out at the end of the frame period FP.

As described above, the image sensor 100 according to the inventive concept may selectively operate in either a global shutter mode or a rolling shutter mode. In an embodiment, an electronic device (e.g., an image processing device) equipped with the image sensor 100 may operate in global shutter mode when shooting a high-speed video and may operate in rolling shutter mode when capturing a high-quality still image or shooting a low-speed video (i.e., when creating a high-quality image). In another embodiment, the image sensor 100 may operate in rolling shutter mode in a high-light environment and in global shutter mode in a low-light environment.

Figure 3:
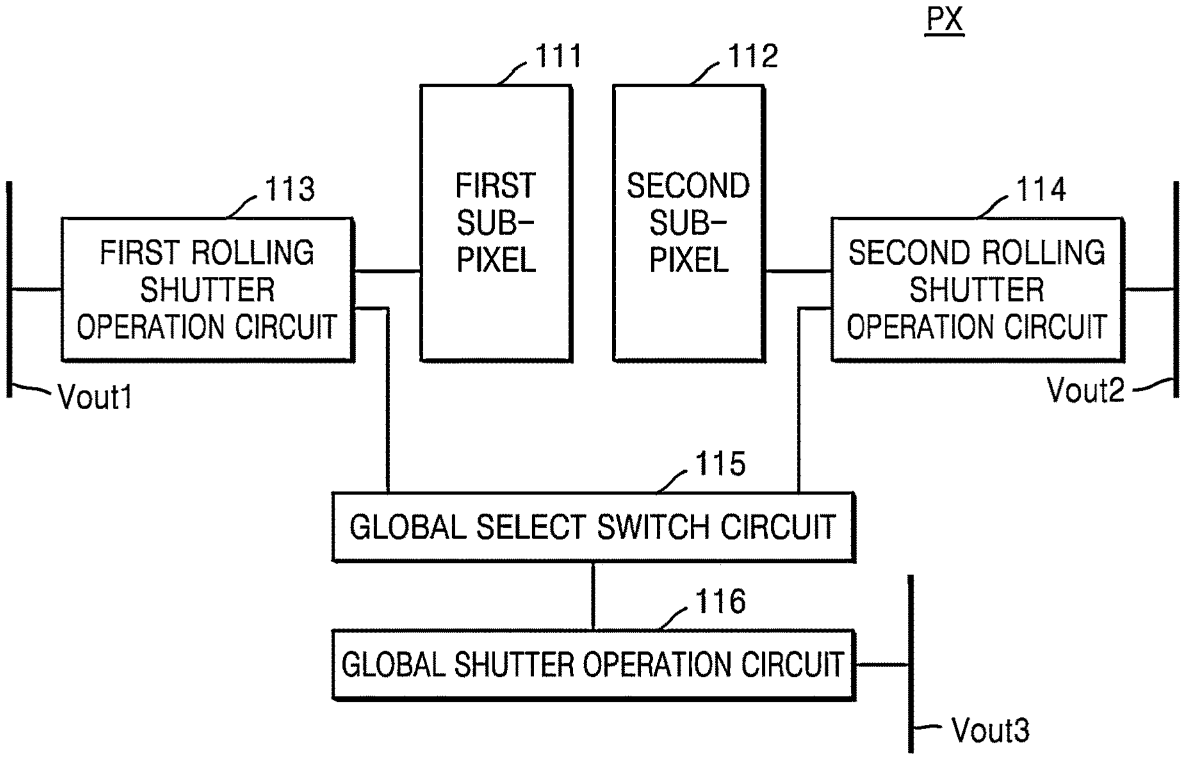
FIG. 3 is a block diagram of a pixel according to an embodiment.

FIG. 3 is a block diagram of a pixel according to an embodiment. A pixel PX in FIG. 3 includes a first sub-pixel 111, a second sub-pixel 112, a first rolling shutter operation circuit 113, a second rolling shutter operation circuit 114, a global select switch circuit 115, and a global shutter operation circuit 116. The first sub-pixel 111 may include a plurality of photoelectric conversion elements. According to an embodiment, the plurality of photoelectric conversion elements included in the first sub-pixel 111 may be connected to a first floating diffusion node. The second sub-pixel 112 may include a plurality of photoelectric conversion elements. According to an embodiment, the plurality of photoelectric conversion elements included in the second sub-pixel 112 may be connected to a second floating diffusion node. The first sub-pixel 111 may be positioned adjacent to the second sub-pixel 112.

In an embodiment of the inventive concept, at least a pair of photoelectric conversion elements and a pair of transfer transistors corresponding to the pair of photoelectric conversion elements may be referred to as one sub-pixel. For example, a first photodiode, a second photodiode, a first transfer transistor, and a second transfer transistor may constitute the first sub-pixel 111, and a third photodiode, a fourth photodiode, a third transfer transistor, and a fourth transfer transistor may constitute the second sub-pixel 112. In an embodiment of the inventive concept, each of the first and second sub-pixels 111 and 112 may share the global select switch circuit 115 and the global shutter operation circuit 116, as described below. In an embodiment of the inventive concept, the pixel PX is shown as including two sub-pixels 111 and 112 but is not limited thereto.

Each of the first sub-pixel 111 and the second sub-pixel 112 included in the pixel PX of FIG. 3 may operate in rolling shutter mode at the same time. The first rolling shutter operation circuit 113 connected to the first sub-pixel 111 may operate the first sub-pixel 111 in rolling shutter mode, and the second rolling shutter operation circuit 114 connected to the second sub-pixel 112 may operate the second sub-pixel 112 in rolling shutter mode. According to an embodiment, the first rolling shutter operation circuit 113 may include a first source follower transistor and a first rolling select transistor. According to an embodiment, the second rolling shutter operation circuit 114 may include a second source follower transistor and a second rolling select transistor. The first rolling shutter operation circuit 113 and the second rolling shutter operation circuit 114 may operate independently. The first rolling shutter operation circuit 113 may be connected to a first output line Vout1, and the second rolling shutter operation circuit 114 may be connected to a second output line Vout2. According to the inventive concept, the first rolling shutter operation circuit 113 and the second rolling shutter operation circuit 114 may output pixel signals according to each rolling shutter operation through separate output lines.

The global select switch circuit 115 may be connected between the first rolling shutter operation circuit 113 and the second rolling shutter operation circuit 114. The global select switch circuit 115 may include at least one transistor. According to the inventive concept, operation in global shutter mode may be controlled by turning on the transistor included in the global select switch circuit 115. According to an embodiment, the pixel PX of FIG. 3 may operate in global shutter mode by binning the first sub-pixel 111 and the second sub-pixel 112. The pixel PX according to the inventive concept may be used as a path to operate in global shutter mode through the global select switch circuit 115.

The global shutter operation circuit 116 may be connected to an output terminal of the global select switch circuit 115. The global shutter operation circuit 116 may control the transistors included in the global shutter operation circuit 116 to operate in global shutter mode when at least one transistor included in the global select switch circuit 115 is turned on. The global shutter operation circuit 116 may be connected to a third output line Vout3. The global shutter operation circuit 116 may output a pixel signal according to the global shutter operation through the third output line Vout3.

The pixel PX according to an embodiment of the inventive concept may have a structure that forms a total of three output lines, according to the rolling shutter operation and according to the global shutter operation in a scheme that supports binning mode operation. According to an embodiment, a pixel according to the inventive concept may structurally have a total of three output lines, including two output lines associated with two rolling shutter operations and one output line associated with a global shutter operation.

The pixel PX according to the inventive concept may operate in global shutter mode or rolling shutter mode through control of the plurality of transistors included in the pixel PX. In the rolling shutter mode, the pixel PX according to the inventive concept may simultaneously output adjacent left and right pixels through separate output lines while one transfer control line is selected. However, in the global shutter mode, the pixel PX according to the inventive concept may perform readout by combining the outputs of adjacent left and right pixels using binning operations (i.e., a binning mode). According to the inventive concept, operation may be possible without adding the transfer control line during full mode readout of rolling shutter mode. That is, according to the inventive concept, adjacent photodiodes connected to one transfer control line may be read out simultaneously, which is economical, and various rolling shutter read-out functions may be performed.

Figure 4:
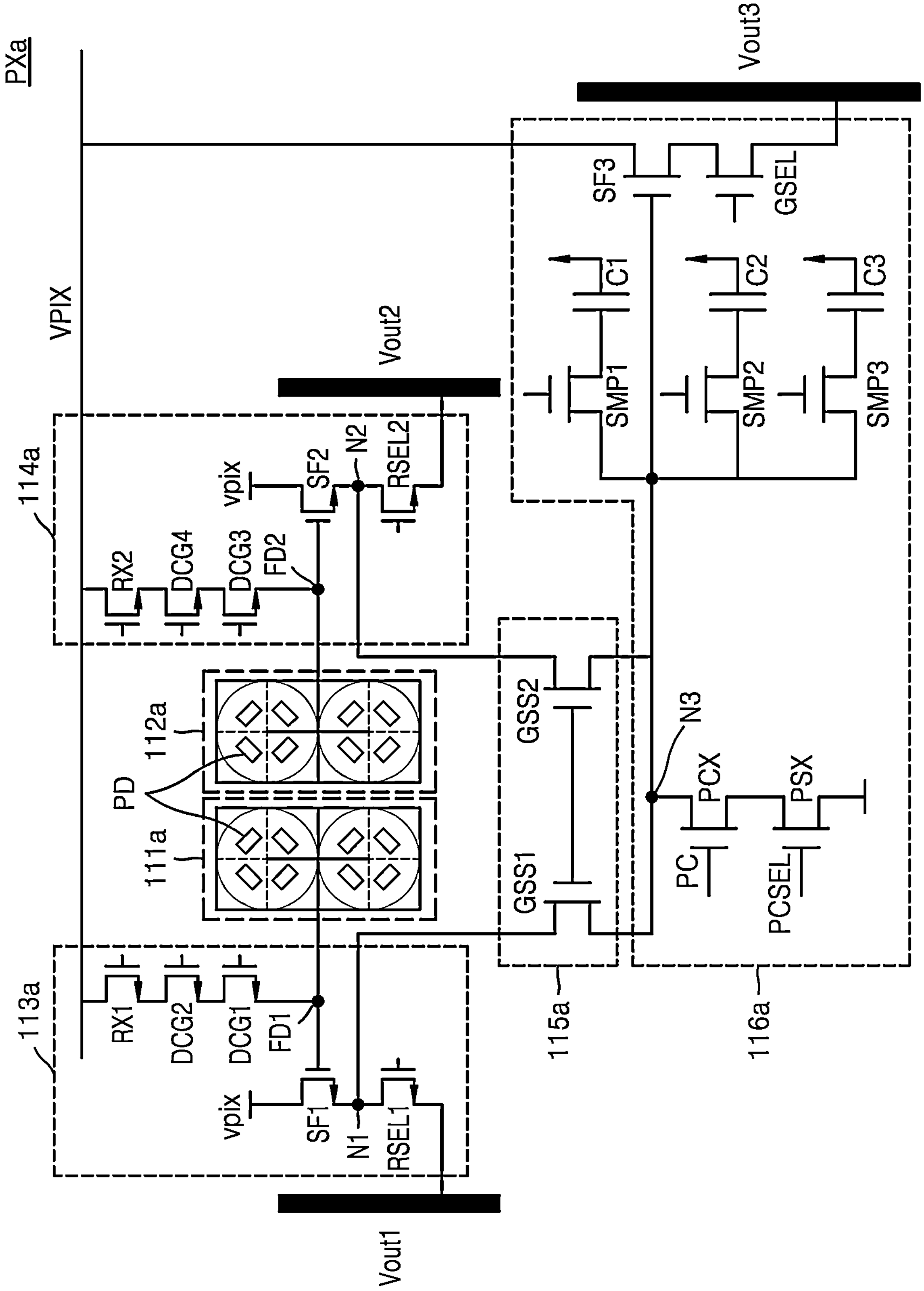
FIG. 4 is a circuit diagram of a pixel according to an embodiment.

The circuit structure of the specific pixel PX according to the inventive concept is described in detail below. In particular, FIG. 4 is a circuit diagram of a pixel according to an embodiment. Referring to FIG. 4, a pixel PXa may include a first sub-pixel 111*a*, a second sub-pixel 112*a*, a first rolling shutter operation circuit 113*a*, a second rolling shutter operation circuit 114*a*, a global select switch circuit 115*a*, and a global shutter operation circuit 116*a*. According to an embodiment, control signals may be applied to a plurality of transistors included in the first rolling shutter operation circuit 113*a*, the second rolling shutter operation circuit 114*a*, the global select switch circuit 115*a*, and the global shutter operation circuit 116*a*, respectively, and at least some of the control signals may be generated from the row driver 120.

The first sub-pixel 111*a* and the second sub-pixel 112*a* may each include a plurality of photodiodes PD. The first sub-pixel 111*a* may include eight photodiodes PD, and the second sub-pixel 112*a* may include eight photodiodes PD. The plurality of photodiodes PD may generate photocharge that varies depending on the intensity of light. For example, the photodiodes PD may generate charge, that is, electrons with negative charge and holes with positive charge, in proportion to the amount of incident light. The number of photodiodes PD included in each of the first sub-pixel 111*a* and the second sub-pixel 112*a* is not limited to that shown in FIG. 4, and each of the first sub-pixel 111*a* and the second sub-pixel 112*a* may include two or more photodiodes.

Although not shown in FIG. 4, transfer transistors may be respectively connected to the plurality of photodiodes PD included in each of the first sub-pixel 111*a* and the second sub-pixel 112*a*. According to an embodiment, a first transfer transistor may be connected between the plurality of photodiodes PD included in the first sub-pixel 111*a* and a first floating diffusion node FD1. A first terminal of the first transfer transistor may be connected to an output terminal of the photodiodes PD, and a second terminal of the first transfer transistor may be connected to the first floating diffusion node FD1. The first transfer transistor may be turned on or off in response to a transfer control signal received from the row driver 120. The first transfer transistor may be turned on and may transmit photocharge generated from the photodiodes PD to the first floating diffusion node FD1. The number of first transfer transistors included in the first sub-pixel 111*a* may correspond to the number of photodiodes PD included in the first sub-pixel 111*a*.

According to an embodiment, the second transfer transistor may be respectively connected between the plurality of photodiodes PD included in the second sub-pixel 112*a* and a second floating diffusion node FD2. A first terminal of the second transfer transistor may be connected to the output terminal of the photodiodes PD, and a second terminal of the second transfer transistor may be connected to the second floating diffusion node FD2. The second transfer transistor may be turned on or off in response to the transfer control signal received from the row driver 120. The second transfer transistor may be turned on and may transmit photocharge generated from the photodiodes PD to the second floating diffusion node FD2. The number of second transfer transistors included in the second sub-pixel 112*a* may correspond to the number of photodiodes PD included in the second sub-pixel 112*a*.

The first rolling shutter operation circuit 113*a* may include a first reset transistor RX1, a first conversion gain control transistor DCG1, a second conversion gain control transistor DCG2, a first source follower transistor SF1, and a first rolling select transistor RSEL1. The first reset transistor RX1 may reset the charge integrated in the first floating diffusion node FD1. A pixel voltage VPIX may be applied to a first terminal of the first reset transistor RX1, and a first terminal of the second conversion gain control transistor DCG2 may be connected to a second terminal of the first reset transistor RX1. The first reset transistor RX1 may be turned on or off in response to a reset control signal received from the row driver 120, and when the first reset transistor RX1, the first conversion gain control transistor DCG1, and the second conversion gain control transistor DCG2 are turned on, the charge integrated in the first floating diffusion node FD1 may be discharged and the first floating diffusion node FD1 may be reset.

The first conversion gain control transistor DCG1 and the second conversion gain control transistor DCG2 may adjust the conversion gain of the first sub-pixel 111*a*. The conversion gain refers to a rate at which charge integrated in the first floating diffusion node FD1 is converted into voltage. The conversion gain can be varied depending on the capacitance of the first floating diffusion node FD1. As the capacitance of the first floating diffusion node FD1 increases, the conversion gain may decrease, and as the capacitance of the first floating diffusion node FD1 decreases, the conversion gain may increase.

The first conversion gain control transistor DCG1 and the second conversion gain control transistor DCG2 may be turned on or off in response to a gain control signal. When the first conversion gain control transistor DCG1 and the second conversion gain control transistor DCG2 are turned on, the capacitance of the first floating diffusion node FD1 may increase and the conversion gain may decrease, and when the first conversion gain control transistor DCG1 and the second conversion gain control transistor DCG2 are turned off, the capacitance of the first floating diffusion node FD1 may decrease and the conversion gain may increase. Therefore, depending on whether the first conversion gain control transistor DCG1 and the second conversion gain control transistor DCG2 are turned on or off, the first sub-pixel 111*a* may operate in high conversion gain (HCG) mode or low conversion gain (LCG) mode. In other words, the first sub-pixel 111*a* may operate in dual conversion gain mode, and the conversion gain mode may be determined by turning on or off the first conversion gain control transistor DCG1 and the second conversion gain control transistor DCG2.

The pixel voltage VPIX may be applied to a first terminal of the first source follower transistor SF1, and a second terminal of the first source follower transistor SF1 may be connected to a first output node N1. The first source follower transistor SF1 as a buffer amplifier may buffer a signal according to the amount of charge stored in the first floating diffusion node FD1. The potential of the first floating diffusion node FD1 may change according to the amount of charge integrated in the first floating diffusion node FD1, and the first source follower transistor SF1 may amplify the potential change at the first floating diffusion node FD1 and output the amplified potential change to the first output node N1. The first source follower transistor SF1 may operate as a source follower and may output a voltage corresponding to the voltage of the first floating diffusion node FD1 to the first output node N1.

A first terminal of the first rolling select transistor RSEL1 may be connected to the first source follower transistor SF1, and a second terminal of the first rolling select transistor RSEL1 may be connected to the first output line Vout1. The first rolling select transistor RSEL1 may be turned on or off in response to a first rolling select control signal. When the first rolling select transistor RSEL1 is turned on, a voltage corresponding to the first output node N1 may be output to the first output line Vout1. At this time, the output voltage may be output in rolling shutter mode.

The second rolling shutter operation circuit 114*a* may include a second reset transistor RX2, a third conversion gain control transistor DCG3, a fourth conversion gain control transistor DCG4, a second source follower transistor SF2, and a second rolling select transistor RSEL2. The operation of the second reset transistor RX2 may correspond to the operation of the first reset transistor RX1, and the operations of the third conversion gain control transistor DCG3 and the fourth conversion gain control transistor DCG4 may correspond to the operations of the first conversion gain control transistor DCG1 and the second conversion gain control transistor DCG2. Since the operation of the second source follower transistor SF2 may correspond to the operation of the first source follower transistor SF1, and the operation of the second rolling select transistor RSEL2 may correspond to the operation of the first rolling select transistor RSEL1, redundant description thereof is omitted.

The first rolling shutter operation circuit 113*a* may control the output of photodiodes included in the first sub-pixel 111*a* to be output in shutter operation mode, and the second rolling shutter operation circuit 114*a* may control the output of photodiodes included in the second sub-pixel 112*a* to be output in shutter operation mode. The first rolling shutter operation circuit 113*a* may output the output of photodiodes included in the first sub-pixel 111*a* through the first output line Vout1, and the second rolling shutter operation circuit 114*a* may output the output of photodiodes included in the second sub-pixel 112*a* through the second output line Vout2. The first rolling shutter operation circuit 113*a* and the second rolling shutter operation circuit 114*a* according to the inventive concept may output the output of the first and second sub-pixels 111*a* and 112*a* connected to the first and second rolling shutter operation circuits 113*a* and 114*a* through the separate output lines Vout1 and Vout2, respectively, and may simultaneously output results of the operation of the adjacent first and second sub-pixels 111*a* and 112*a* in rolling shutter mode. That is, according to an embodiment of the inventive concept, by separating the output lines Vout1 and Vout2 of the first rolling shutter operation circuit 113*a* and the second rolling shutter operation circuit 114*a*, the processing results of each of adjacent first and second sub-pixels 111*a* and 112*a* may be output simultaneously.

The global select switch circuit 115*a* may be positioned between the first rolling shutter operation circuit 113*a* and the second rolling shutter operation circuit 114*a*. The global select switch circuit 115*a* may be connected between the first output node N1 of the first rolling shutter operation circuit 113*a* and the second output node N2 of the second rolling shutter operation circuit 114*a*. The first output node N1 may be a node between the first source follower transistor SF1 and the first rolling select transistor RSEL1. The second output node N2 may be a node between the second source follower transistor SF2 and the second rolling select transistor RSEL2. According to an embodiment, a transistor disclosed in the present invention may include a current carrying terminal at both ends. According to an embodiment, the global select switch circuit 115*a* comprises a transistor having a first current carrying terminal electrically coupled to the first output node N1 and a second current carrying terminal electrically coupled to the second output node N2. The global select switch circuit 115*a* may include a first global select switch transistor GSS1 and a second global select switch transistor GSS2. A first current carrying terminal of the first global select switch transistor GSS1 may be connected to the first output node N1, and a second current carrying terminal of the first global select switch transistor GSS1 may be connected to a third output node N3 of the global shutter operation circuit 116*a*. a first current carrying terminal of the second global select switch transistor GSS2 may be connected to the second output node N2, and a second current carrying terminal of the second global select switch transistor GSS2 may be connected to the third output node N3 of the global shutter operation circuit 116*a*. The first global select switch transistor GSS1 and the second global select switch transistor GSS2 may be operated by the same control signal. A gate terminal of the first global select switch transistor GSS1 and a gate terminal of the second global select switch transistor GSS2 are responsive to the same control signal. According to an embodiment, the first global select switch transistor GSS1 and the second global select switch transistor GSS2 may be turned on or off in response to a global select control signal. When the first global select switch transistor GSS1 and the second global select switch transistor GSS2 are turned on, the first output node N1 and the second output node N2 may be connected to the third output node N3 of the global shutter operation circuit 116*a*, thereby controlling the output of the first sub-pixel 111*a* and the output of the second sub-pixel 112*a* to be read out through global shutter operation.

The global shutter operation circuit 116*a* may include a precharge transistor PCX. A first terminal of the precharge transistor PCX may be connected to the third output node N3, and a second terminal thereof may be connected to a precharge select transistor PSX. The third output node N3 may be a node to which the global shutter operation circuit 116*a* and the global select switch circuit 115*a* are connected. The precharge transistor PCX may precharge the third output node N3 according to the precharge control signal PC received from the row driver 120.

The global shutter operation circuit 116*a* may include the precharge select transistor PSX. A first terminal of the precharge select transistor PSX may be connected to the precharge transistor PCX, and a ground voltage may be applied to a second terminal of the precharge select transistor PSX. In response to a precharge select control signal PCSEL received from the row driver 120, the precharge select transistor PSX may be turned on or off and may reset the third output node N3. The precharge transistor PCX and the precharge select transistor PSX may be connected in series. According to an embodiment, the precharge transistor PCX and the precharge select transistor PSX may be precharge circuits.

The global shutter operation circuit 116*a* may include a first sampling transistor SMP1. A first terminal of the first sampling transistor SMP1 may be connected to the third output node N3, and a second terminal of the first sampling transistor SMP1 may be connected to a first capacitor C1. In response to a first sampling control signal received from the row driver 120, the first sampling transistor SMP1 may be turned on or off and may connect the first capacitor C1 to the third output node N3.

The pixel voltage VPIX may be applied to a first terminal of the first capacitor C1, and a second terminal of the first capacitor C1 may be connected to the first sampling transistor SMP1. Charge may be integrated in the first capacitor C1 according to a switching operation of the first sampling transistor SMP1. For example, charge may be integrated in the first capacitor C1 according to a reset operation in which the first floating diffusion node FD1 and/or the second floating diffusion node FD2 are reset.

The global shutter operation circuit 116*a* may include a second sampling transistor SMP2. A first terminal of the second sampling transistor SMP2 may be connected to the third output node N3, and a second terminal of the second sampling transistor SMP2 may be connected to a second capacitor C2. In response to a second sampling control signal received from the row driver 120, the second sampling transistor SMP2 may be turned on or off, and the second capacitor C2 may be connected to the third output node N3.

The pixel voltage VPIX may be applied to a first terminal of the second capacitor C2, and a second terminal of the second capacitor C2 may be connected to the second sampling transistor SMP2. Charge may be integrated in the second capacitor C2 according to a switching operation of the second sampling transistor SMP2. For example, in the second capacitor C2, charge may be integrated according to a photocharge integration operation in which photocharge generated from the photodiodes PD is integrated in the first floating diffusion node FD1 and/or the second floating diffusion node FD2.

The global shutter operation circuit 116*a* may include a third sampling transistor SMP3. A first terminal of the third sampling transistor SMP3 may be connected to the third output node N3, and a second terminal of the third sampling transistor SMP3 may be connected to a third capacitor C3. In response to a third sampling control signal received from the row driver 120, the third sampling transistor SMP3 may be turned on or off, and the third capacitor C3 may be connected to the third output node N3.

The pixel voltage VPIX may be applied to a first terminal of the third capacitor C3, and a second terminal of the third capacitor C3 may be connected to the third sampling transistor SMP3. Charge may be integrated in the third capacitor C3 according to a switching operation of the third sampling transistor SMP3. For example, charge according to an AF operation of the first sub-pixel 111*a* and the second sub-pixel 112*a* may be integrated in the third capacitor C3. According to an embodiment, AF signals corresponding to the left and right directions may be sampled by primarily transmitting signals corresponding to photodiodes located to the left of the first sub-pixel 111*a* and the second sub-pixel 112*a* to the global shutter operation circuit 116*a*, and secondarily transmitting signals corresponding to photodiodes located to the right of the first sub-pixel 111*a* and the second sub-pixel 112*a* to the global shutter operation circuit 116*a*. According to an embodiment, the left AF signals may be stored by controlling the turning on the transfer transistors corresponding to the photodiodes located to the left of the first sub-pixel 111*a* and the second sub-pixel 112*a*, and the right AF signals may be stored by controlling turning on the transfer transistors corresponding to the photodiodes located to the right of the first sub-pixel 111*a* and the second sub-pixel 112*a*.

According to an embodiment, when the pixel PXa operates in global shutter mode, the first sampling transistor SMP1, the second sampling transistor SMP2, the third sampling transistor SMP3, the first capacitor C1, the second capacitor C2, and the third capacitor C3 may operate as sampling circuits for sampling the voltage output through the third output node N3. According to an embodiment, the first sampling transistor SMP1, the second sampling transistor SMP2, the third sampling transistor SMP3, the first capacitor C1, the second capacitor C2, and the third capacitor C3 may be sampling circuits.

The global shutter operation circuit 116*a* may include a third source follower transistor SF3 and a global select transistor GSEL. The pixel voltage VPIX may be applied to a first terminal of the third source follower transistor SF3, and a second terminal of the third source follower transistor SF3 may be connected to the global select transistor GSEL. The third source follower transistor SF3 may amplify and output the potential change at the third output node N3.

A first terminal of the global select transistor GSEL may be connected to the third source follower transistor SF3, and a second terminal of the global select transistor GSEL may be connected to the third output line Vout3. The global select transistor GSEL may be turned on or off in response to a select control signal received from the row driver 120. When the global select transistor GSEL is turned on, the reset signal corresponding to the reset operation, the image signal corresponding to the charge integration operation, or the AF signal corresponding to the AF operation may be output to the third output line Vout3.

That is, the third source follower transistor SF3 and the global select transistor GSEL may output a pixel signal according to the potential change at the third output node N3 to the third output line Vout3, and a pixel signal corresponding to one of the amount of charge stored in the first capacitor C1, the amount of charge stored in the second capacitor C2, and the amount of charge stored in the third capacitor C3 may be output through the third output line Vout3.

Figure 5A:
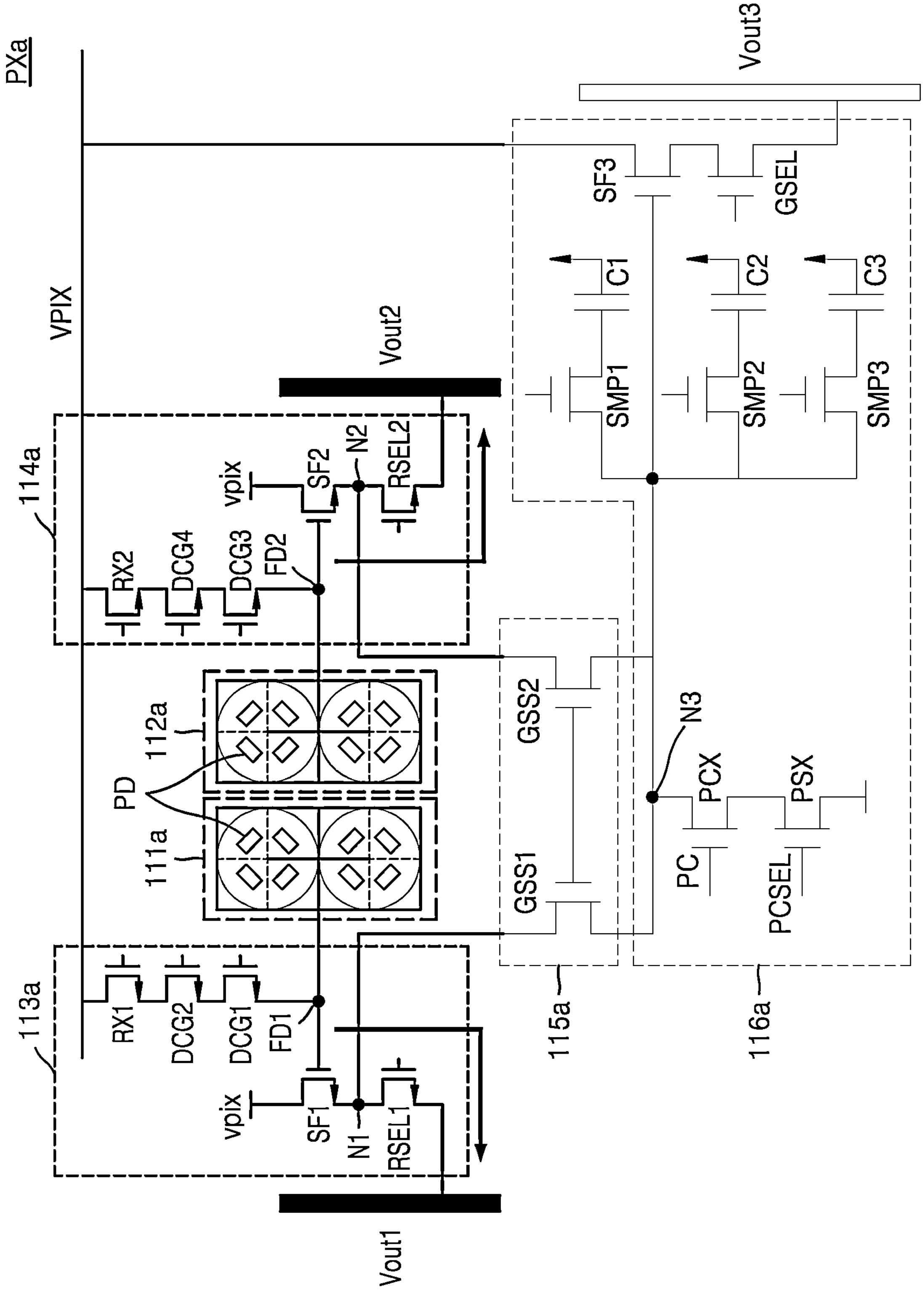
FIGS. 5A and 5B illustrate readout operations of a pixel in global shutter mode and rolling shutter mode according to an embodiment.
Figure 5B:
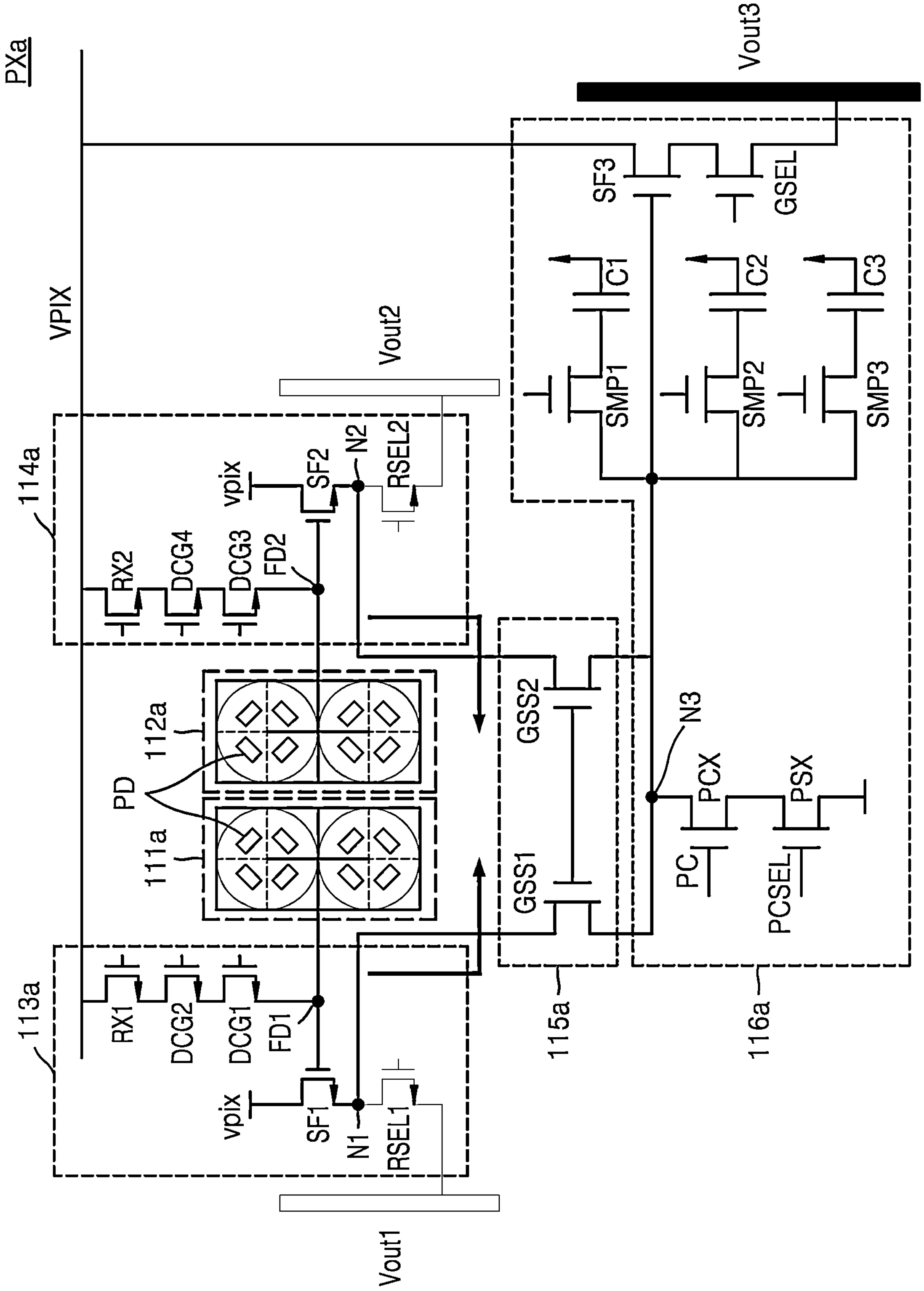

FIGS. 5A and 5B illustrate readout operations of a pixel in global shutter mode and rolling shutter mode according to an embodiment. Referring to FIG. 5A, when the pixel PXa operates in rolling shutter mode, during the readout period, the first rolling select transistor RSEL1 may be turned on, the second rolling select transistor RSEL2 may be turned on, and the first global select switch transistor GSS1 and the second global select switch transistor GSS2 may be turned off. Thus, advantageously, the charge integrated in the first floating diffusion node FD1 and the charge integrated in the second floating diffusion node FD2 may be simultaneously output through the first output line Vout1 and the second output line Vout2, respectively.

Referring to FIG. 5B, when the pixel PXa operates in global shutter mode, the first rolling select transistor RSEL1 may be turned off, the second rolling select transistor RSEL2 may be turned off, and the first global select switch transistor GSS1 and the second global select switch transistor GSS2 may be turned on. Accordingly, during the GSDP, the reset voltage, the image voltage, and the AF voltage stored in the first capacitor C1, the second capacitor C2, and the third capacitor C3 may be output as pixel signals to the third output line Vout3 through the global select transistor GSEL.

According to an embodiment, when the pixel PXa operates in global shutter mode, by binning the outputs of photodiodes included in the first sub-pixel 111*a* and the second sub-pixel 112*a*, the output corresponding to all photodiodes included in the pixel PXa may be output in global shutter mode. According to an embodiment, the pixel PXa may operate in 4-SUM mode. According to an embodiment, the pixel PXa may operate in 2-SUM mode. According to an embodiment, in a case where the pixel PXa includes two sub-pixels as in the inventive concept, operating in global shutter mode by binning the two sub-pixels may correspond to operating in 2-SUM mode. According to an embodiment, in a case where the pixel PXa includes four sub-pixels, operating in global shutter mode by binning the four sub-pixels may correspond to operating in 4-SUM mode.

Figure 6:
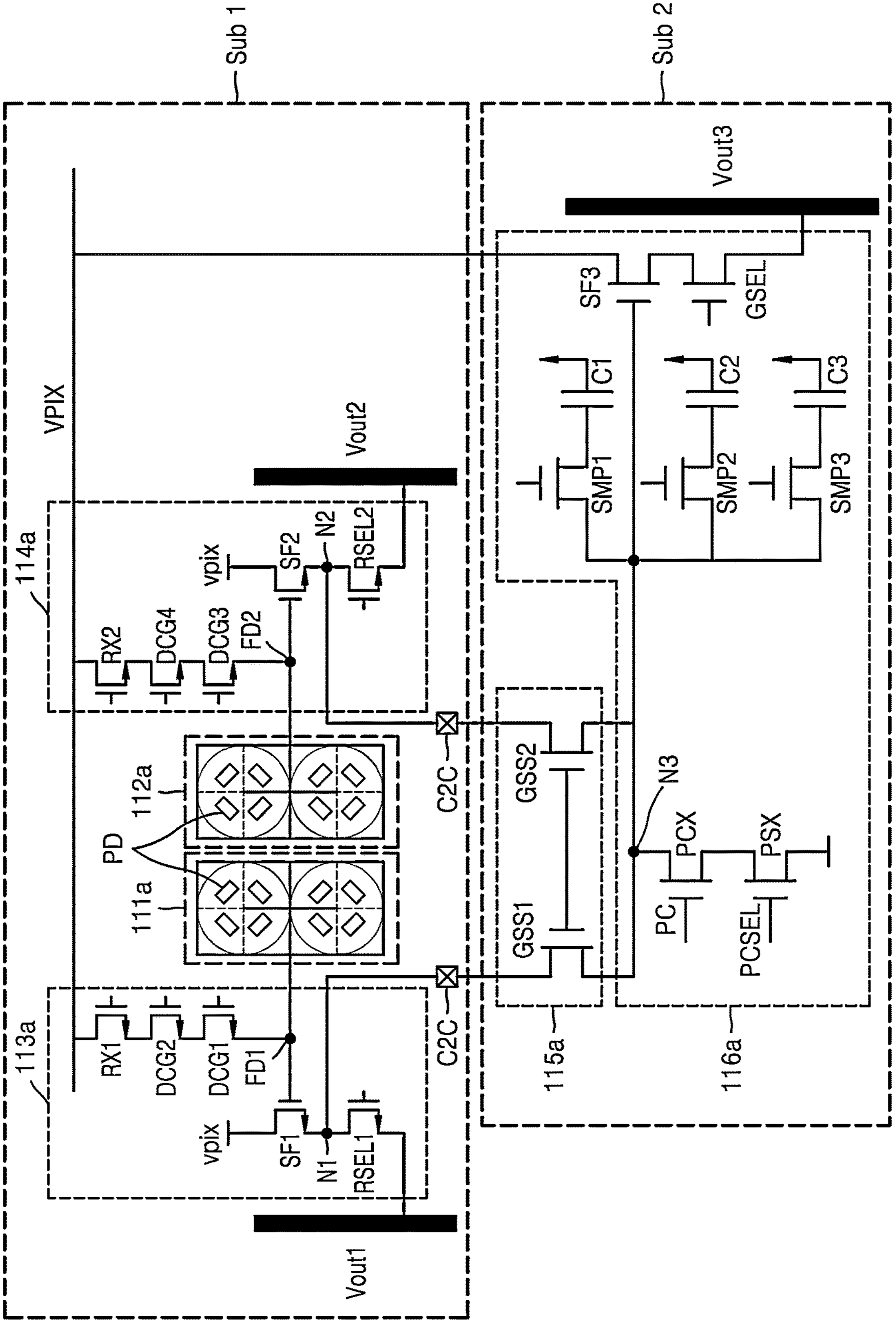
FIG. 6 illustrates an arrangement structure of components included in a pixel according to an embodiment.

FIG. 6 illustrates an arrangement structure of components included in a pixel according to an embodiment. In FIG. 6, a description of parts that overlap with those described in FIG. 4 is omitted. Referring to FIG. 6, the first rolling shutter operation circuit 113*a* and the global select switch circuit 115*a* may be connected through metal-to-metal bonding (chip-to-chip (C2C)). Referring to FIG. 6, the second rolling shutter operation circuit 114*a* may be connected to the global select switch circuit 115*a* through C2C. According to an embodiment, the metal may be copper (Cu). However, the metal is not limited to metals such as copper.

Referring to FIG. 6, a first substrate Sub 1 and a second substrate Sub 2 may be separated based on C2C. Through C2C, the first substrate Sub 1 may be electrically connected to the second substrate Sub 2. The first substrate Sub 1 and the second substrate Sub 2 may be stacked on each other. According to some embodiments, based on C2C, upward components may be placed on the first substrate Sub 1, and downward components may be placed on the second substrate Sub 2.

As shown, the first sub-pixel 111*a*, the second sub-pixel 112*a*, the first rolling shutter operation circuit 113*a*, and the second rolling shutter operation circuit 114*a* may be disposed on the first substrate Sub 1, whereas the global select switch circuit 115*a* and the global shutter operation circuit 116*a* may be disposed on the second substrate Sub 2. In the description of FIG. 6, the C2C configuration is not a circuit component included in the circuit of a pixel, but is included in circuit diagrams of a pixel in FIGS. 7 to 9 described below for convenience of explanation. The C2C shown in the circuit diagrams of FIGS. 7 to 9 to be described below may refer to a case where the components placed on both ends of the C2C are placed on different substrates based on the C2C component. Additionally, this may mean that the components placed on different substrates may be electrically connected through C2C. In an embodiment of the inventive concept, C2C may be referred to as a C2C structure.

Figure 7:
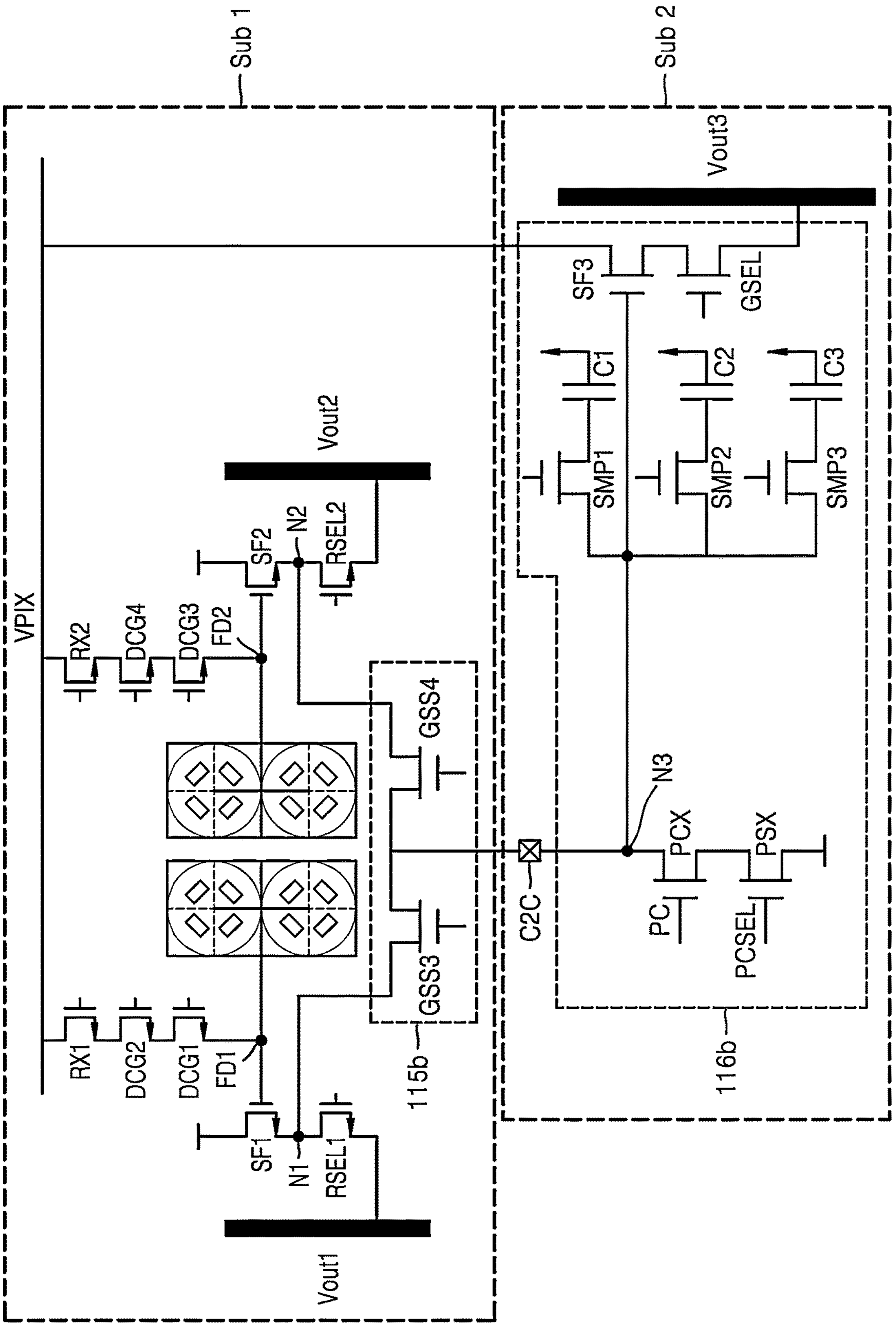
FIG. 7 is a circuit diagram of a pixel according to an embodiment.

FIG. 7 is a circuit diagram of a pixel according to an embodiment. In the description of FIG. 7, a description of the same configuration as the circuit explained in FIG. 4 is omitted. Referring to a pixel PXb of FIG. 7, the configuration of a global select switch circuit 115*b* may be different from that of FIG. 4. The global select switch circuit 115*b* may include a first global select switch transistor GSS3 and a second global select switch transistor GSS4. One end of the first global select switch transistor GSS3 may be connected to the first output node N1, and the other end of the first global select switch transistor GSS3 may be connected to the third output node N3. One end of the second global select switch transistor GSS4 may be connected to the second output node N2, and the other end of the second global select switch transistor GSS4 may be connected to the third output node N3. According to an embodiment, the first global select switch transistor GSS3 and the second global select switch transistor GSS4 may be turned on or off by different control signals. A gate terminal of the first global select switch transistor GSS3 and a gate terminal of the second global select switch transistor GSS4 are responsive to different control signals.

Additionally, referring to FIG. 7, the global select switch circuit 115*b* may be disposed on the first substrate Sub 1, and the global shutter operation circuit 116*b* may be disposed on the second substrate Sub 2. As the global select switch circuit 115*b* is disposed on the first substrate Sub 1, one C2C connected to an output terminal of the global select switch circuit 115*b* may be provided, thereby reducing the number of C2C compared to the embodiment of FIG. 6.

Figure 8:
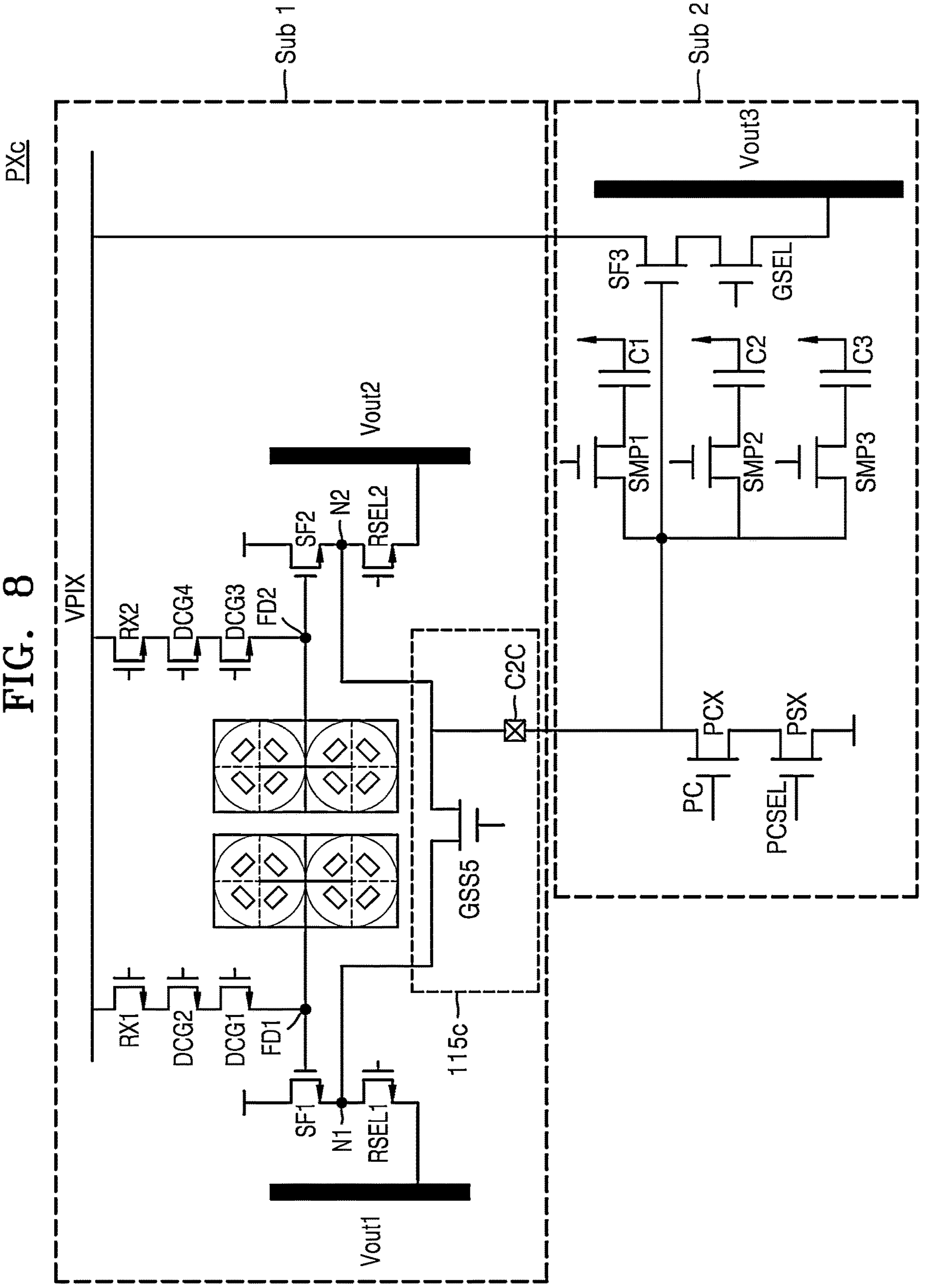
FIG. 8 is a circuit diagram of a pixel according to an embodiment.

FIG. 8 is a circuit diagram of a pixel according to an embodiment. In the description of FIG. 8, a description of the same configuration as the circuit explained in FIG. 4 is omitted. Referring to a pixel PXc of FIG. 8, the configuration of a global select switch circuit 115*c* may be different from that of FIG. 4. A global select switch circuit 115*c* of FIG. 8 may include a global select switch transistor GSS5. One end of the global select switch transistor GSS5 may be connected to the first output node N1, and the other end of the global select switch transistor GSS5 may be connected to the second output node N2. The global select switch transistor GSS5 may be turned on or off by the global select control signal.

Referring to an embodiment of FIG. 8, the global select switch circuit 115*c* may include only one global select switch transistor. According to an embodiment of FIG. 8, one C2C connected to an output terminal (e.g., source/drain terminal) of the global select switch circuit 115*c* may be provided.

Figure 9:
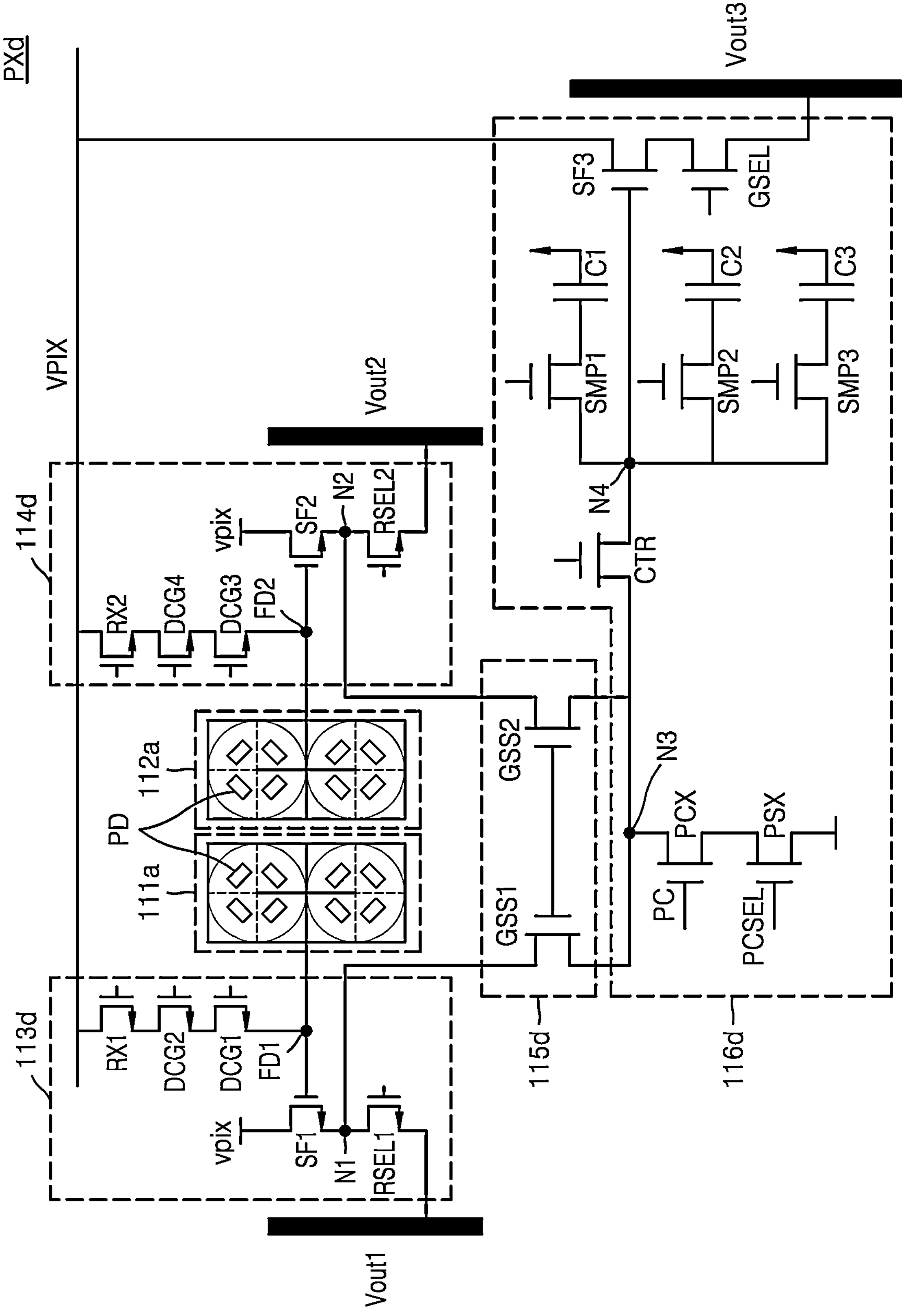
FIG. 9 is a circuit diagram of a pixel according to an embodiment.

FIG. 9 is a circuit diagram of a pixel according to an embodiment. In the description of FIG. 9, a description of the same configuration as the circuit explained in FIG. 4 is omitted. Referring to a pixel PXd of FIG. 9, the configuration of a global shutter operation circuit 116*d* may be different from that of FIG. 4. The global shutter operation circuit 116*d* may further include a capacitor control transistor CTR. According to an embodiment, the capacitor control transistor CTR may be connected between the third output node N3 and a fourth output node N4. According to an embodiment, the fourth output node N4 may be a node connected to the first sampling transistor SMP1, the second sampling transistor SMP2, and the third sampling transistor SMP3. The capacitor control transistor CTR may be turned on or off in response to a capacitor control signal received from the row driver 120, and may reset the fourth output node N4. The fourth output node N4 may have parasitic capacitance. In an embodiment of FIG. 9, the pixel PXd is shown as including one capacitor control transistor CTR, but the inventive concept is not limited thereto. The pixel PXd as a transistor for resetting the fourth output node N4 may include a various number of capacitor control transistors CTR.

Figure 10:
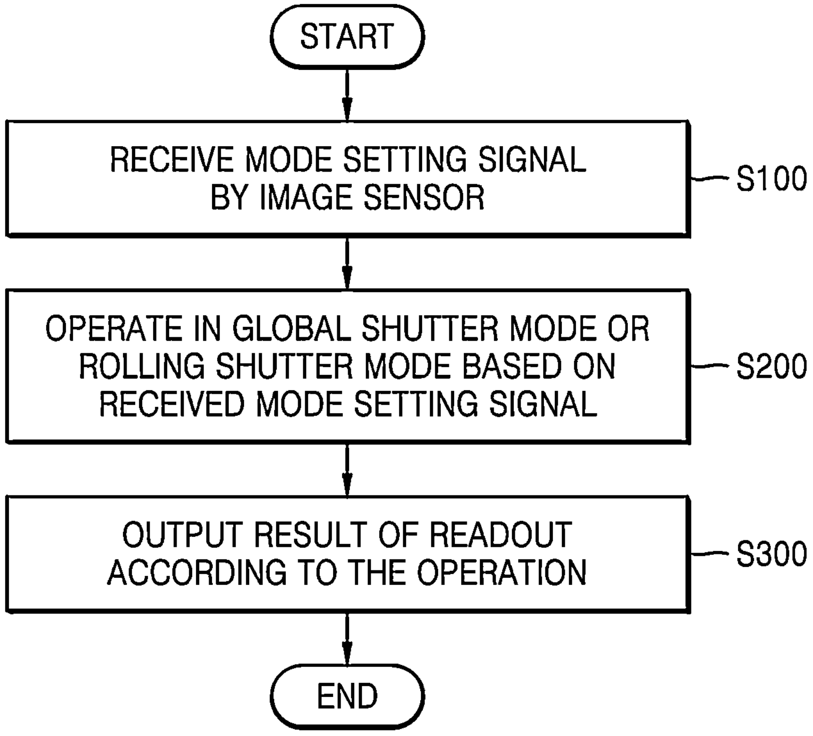
FIGS. 10 to 12 are flowcharts of a pixel operation method according to an embodiment.
Figure 11:
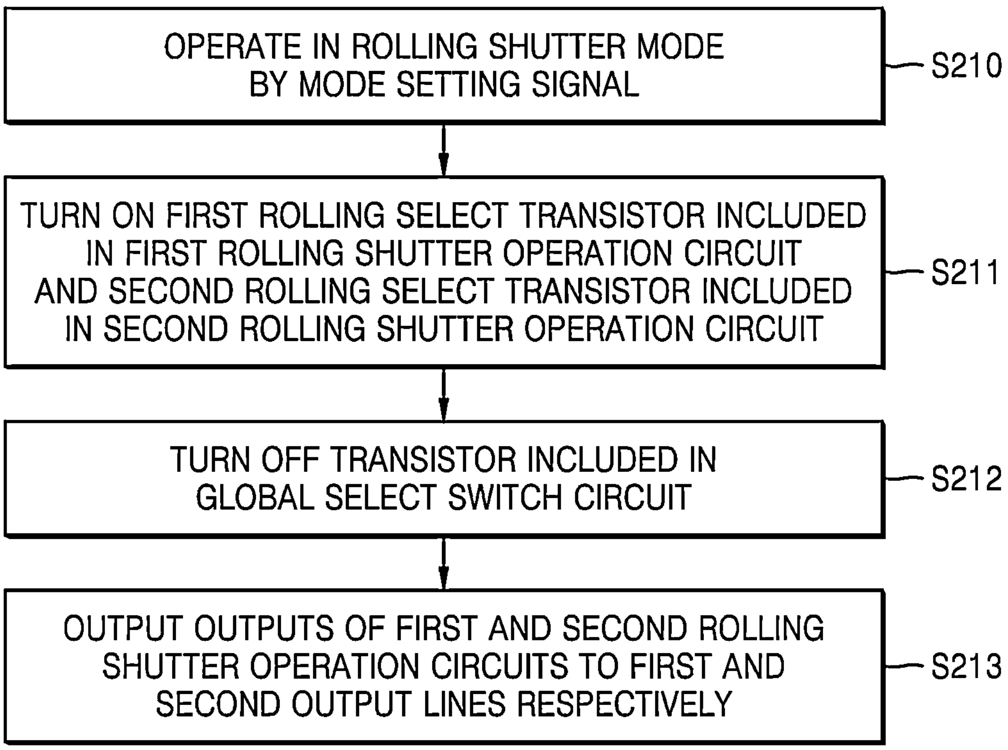
Figure 12:
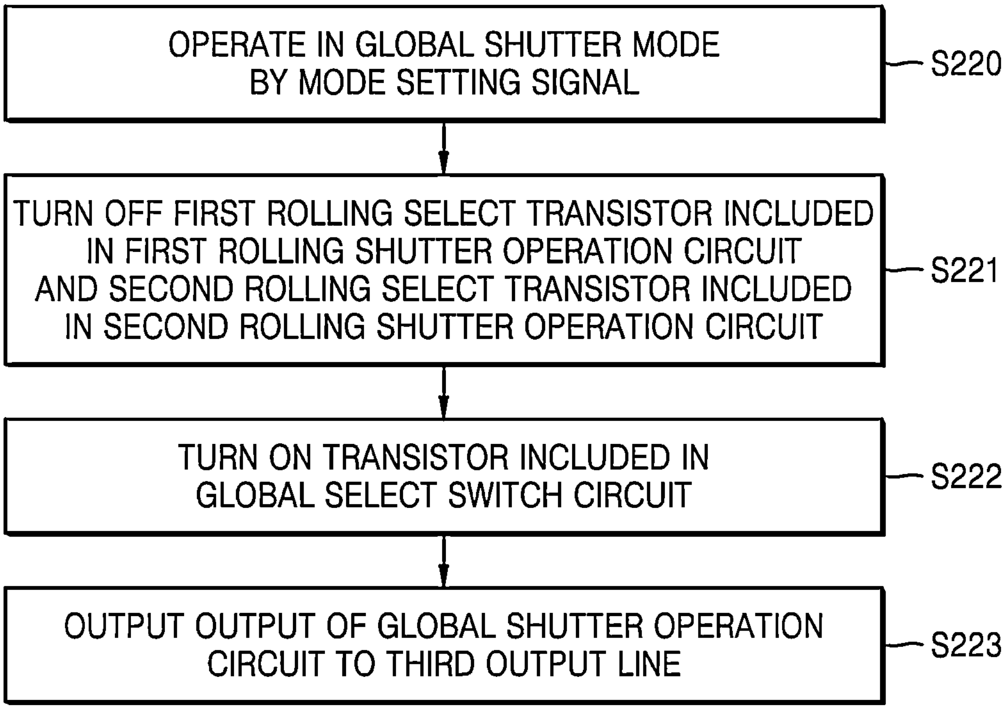

FIGS. 10 to 12 are flowcharts of a pixel operation method according to an embodiment. Referring to FIG. 10, in operation S100, an image sensor may receive a mode setting signal. According to an embodiment, the mode setting signal may be received from an application processor (AP) of FIG. 14A, which is described below. In operation S200, based on the received mode setting signal, the image sensor may operate in global shutter mode or rolling shutter mode during the readout period. According to an embodiment, the image sensor may operate in global shutter mode to read out pixels, or operate in rolling shutter mode to read out pixels. In operation S300, the image sensor may output the result of readout in global shutter mode or rolling shutter mode determined in operation S200.

The flowchart shown in FIGS. 11 and 12 may be operations included in operation S200 of FIG. 10. For example, FIG. 11 may be a flowchart when the image sensor operates in rolling shutter mode, whereas FIG. 12 may be a flowchart when the image sensor operates in global shutter mode.

Referring to operation S210 of FIG. 11, the image sensor may be determined to operate in rolling shutter mode based on the received mode setting signal. Referring to operation S211, the readout circuit may generate control signals to turn on the first rolling select transistor included in the first rolling shutter operation circuit and the second rolling select transistor included in the second rolling shutter operation circuit, and may apply the control signals to pixels. Accordingly, the output of each of the first sub-pixel connected to the first rolling shutter operation circuit and the second sub-pixel connected to the second rolling shutter operation circuit may be read out through rolling shutter mode. Referring to operation S212, the readout circuit may generate control signals to turn off transistors included in the global select switch circuit, and may apply the control signals to the pixels. Thus, it is possible to block the operation in global shutter mode. Referring to operation S213, the outputs of the first rolling shutter operation circuit and the second rolling shutter operation circuit, for example, the reset voltage, the image voltage, or the AF voltage, may be output as pixel signals to the first output line and the second output line, respectively.

Referring to operation S220 of FIG. 12, the image sensor may be determined to operate in global shutter mode based on the received mode setting signal. Referring to operation S221, the readout circuit may generate control signals to turn off the first rolling select transistor included in the first rolling shutter operation circuit and the second rolling select transistor included in the second rolling shutter operation circuit, and may apply the control signals to the pixels. Thus, it is possible to block the operation in rolling shutter mode. Referring to operation S222, the readout circuit may generate control signals to turn on the transistors included in the global select switch circuit and apply the control signals to the pixels. Accordingly, the result of binning the first sub-pixel and the second sub-pixel may be read out by operating in global shutter mode. Referring to operation S223, the output of the global shutter operation circuit, for example, the reset voltage, the image voltage, or the AF voltage, may be output as pixel signals through the third output line.

According to the inventive concept, in the image sensor including pixels operable in each of global shutter mode and rolling shutter mode, a hybrid type readout may be possible by separately processing the output lines when operating in global shutter mode and when operating in rolling shutter mode. According to an embodiment, a pixel of the inventive concept may include at least two or more sub-pixels, may operate in binning mode that combines the outputs of two or more sub-pixels in global shutter mode, and may separately output the outputs of sub-pixels through connected output line respectively in rolling shutter mode.

Figure 13A:
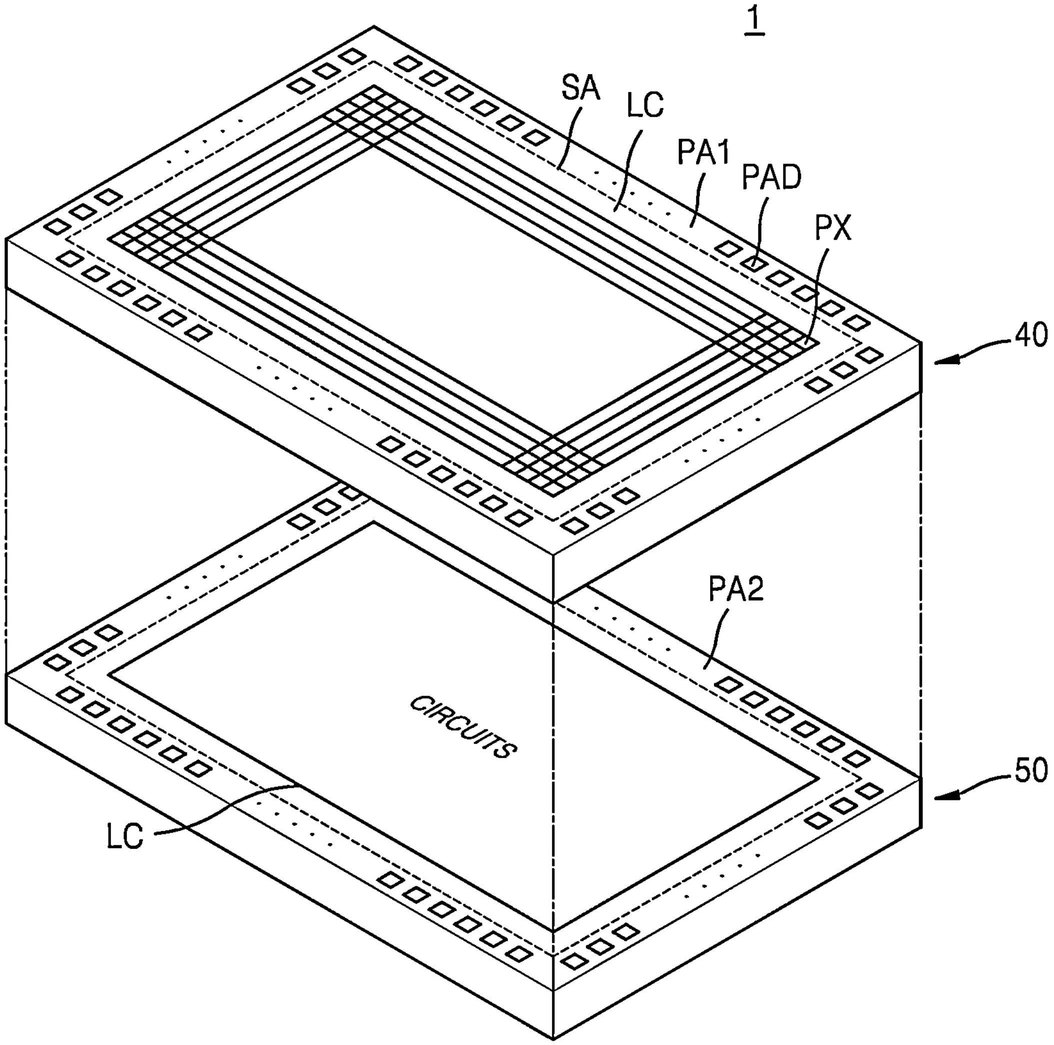
FIGS. 13A and 13B show stack structures of an image sensor according to an embodiment.
Figure 13B:
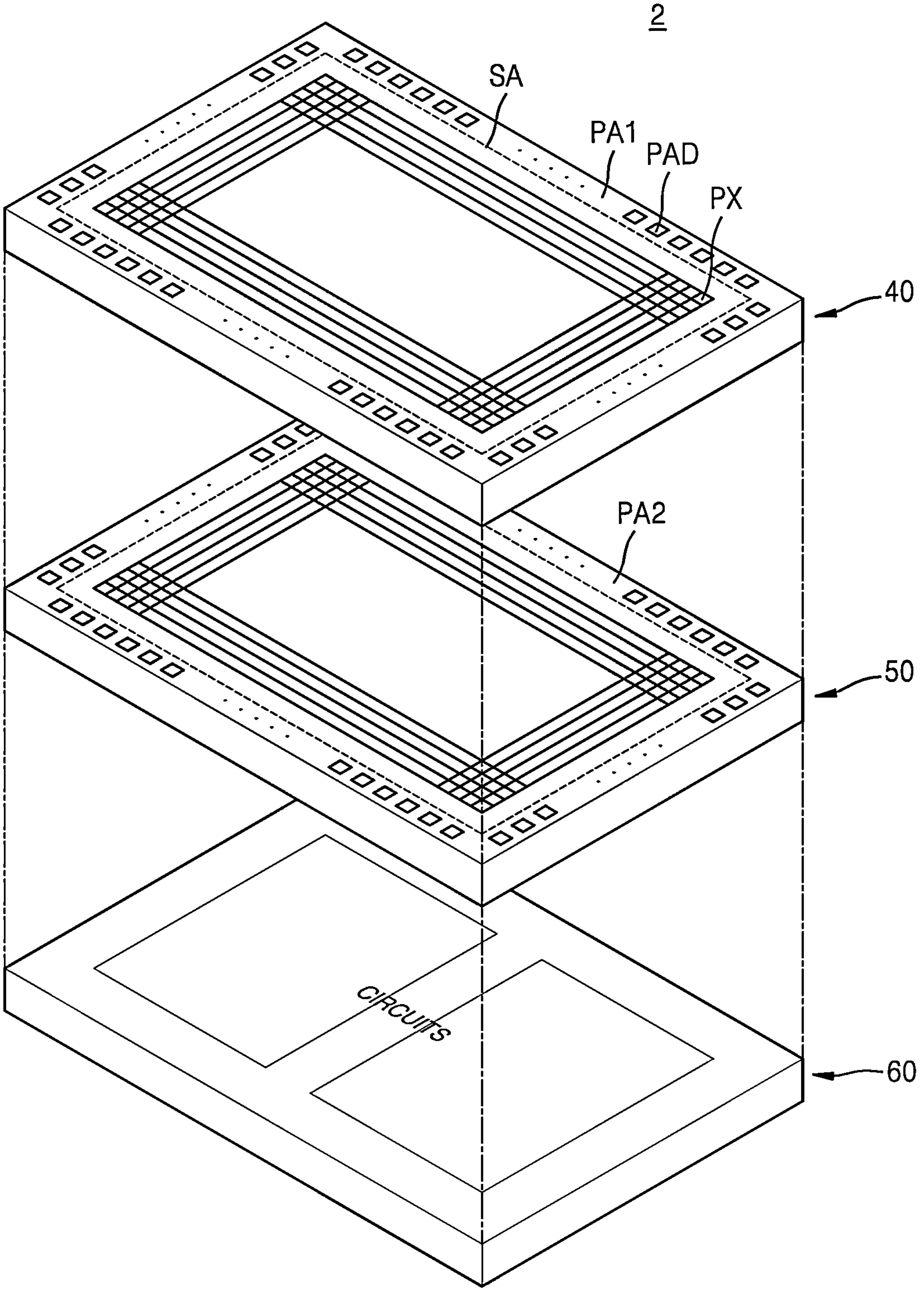

FIGS. 13A and 13B show stack structures of an image sensor according to an embodiment. Referring to FIG. 13A, an image sensor 1 may include an upper chip 40 and a lower chip 50. The upper chip 40 may include a sensing area SA where a plurality of pixels PX are provided, a circuit area LC where elements for driving the plurality of pixels PX are provided, and a pad area PA1 around the sensing area SA and the circuit area LC. A plurality of upper pads PAD may be positioned in the pad area PA1, and may be connected to elements provided on the lower chip 50 through vias and the like.

The lower chip 50 may include a circuit area LC and a pad area PA2 around the circuit area LC, and peripheral circuits of the pixel array (110 in FIG. 1), such as the row driver 120, the ADC circuit 140, the ramp signal generator 130, the timing controller 180, and the signal processor 190 may be positioned in the circuit area LC. In an embodiment, the lower chip 50 may include a memory area and a dummy area. In the memory area, memory elements such as dynamic random access memory (DRAM) elements or static random access memory (SRAM) elements may be positioned. However, the memory elements positioned in the memory area are not limited to the DRAM elements or the SRAM elements. The dummy area may support the upper chip 40 rather than storing data. According to an embodiment, the upper chip 40 may be connected to the lower chip 50 through C2C.

Referring to FIG. 13B, an image sensor 2 may include a plurality of stacked chips. For example, the pixel array 110 may be formed in an upper chip 40 and an intermediate chip 50, and peripheral circuits or memory of the pixel array 110 may be formed in a lower chip 60. According to an embodiment, the first sub-pixel, the second sub-pixel, the first rolling shutter operation circuit, and the second rolling shutter operation circuit of the pixel may be formed on the upper chip 40, and the global select switch circuit and the global shutter operation circuit may be formed in the intermediate chip 50. According to an embodiment, the upper chip 40 and the intermediate chip 50 may be connected through C2C. The lower chip 60 may include a circuit area LC, and peripheral circuits of the pixel array (110 in FIG. 1) may be formed in the circuit area LC. In an embodiment, the lower chip 60 may include a memory area and a dummy area. In an embodiment, the upper chip 40 and the intermediate chip 50 may be stacked on each other at a wafer level, and the lower chip 60 may be attached to the bottom of the intermediate chip 50 at a chip level.

Figure 14A:
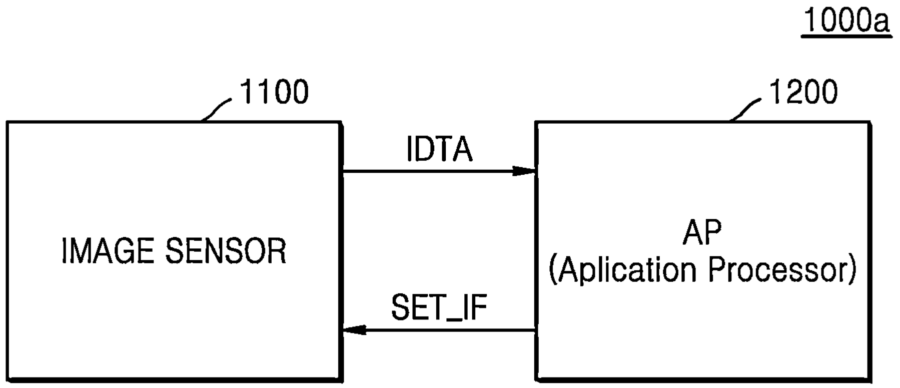
FIGS. 14A and 14B are block diagrams of an electronic device according to an embodiment.
Figure 14B:
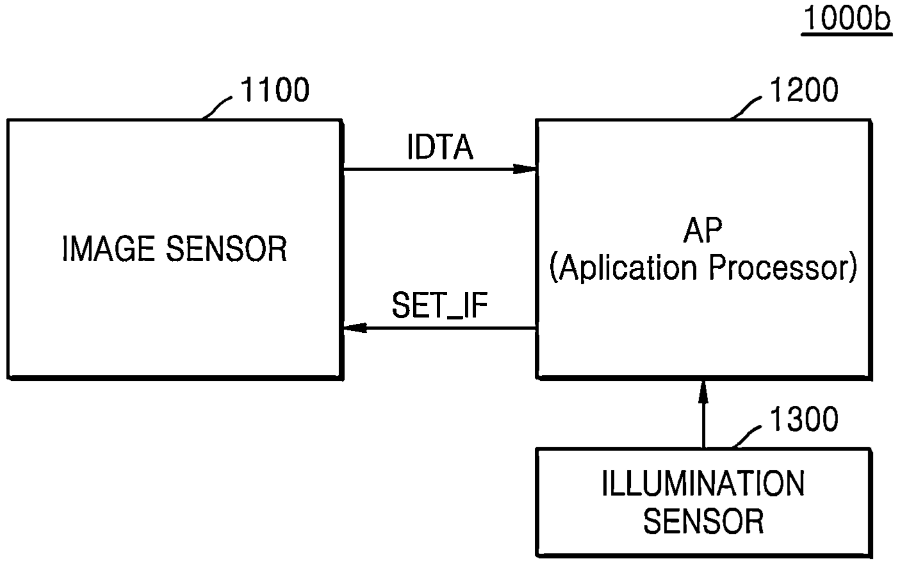

FIGS. 14A and 14B are block diagrams of an electronic device according to an embodiment. Referring to FIGS. 14A and 14B, an electronic device 1000*a* and 1000*b* may include an image sensor 1100 and an AP 1200. According to an embodiment, the electronic device 1000*a* and 1000*b* may be an image processing device.

The AP 1200 may transmit control signals for controlling the operation of an image sensor 1100 to the image sensor 1100. The control signals may include, for example, setting information SET_IF for setting operation mode, shuttering mode, conversion gain mode, and the like of the image sensor 1100. The setting information SET_IF may be a mode setting signal. Transmission of the control signals may be performed based on, e.g., an I2C-based interface. The control signals may further include configuration data of the image sensor 1100, such as lens shading correction value, crosstalk coefficient, analog gain, digital gain, frame rate setting value, etc.

The image sensor 1100 may generate image data IDTA by capturing an object based on the received control signals. The image data IDTA may include still images and moving images. The image sensor 1100 may perform signal processing such as image quality compensation, binning, and downsizing on the image data IDTA, and the image quality compensation may include signal processing such as black level compensation, lens shading compensation, crosstalk compensation, and bad pixel compensation.

The pixel array (110 in FIG. 1) of the image sensor 1100 may operate in global shutter mode or rolling shutter mode. Additionally, the pixel array 110 may operate in HCG mode, LCG mode, or dual conversion gain mode. In an embodiment, at least some pixels among the plurality of pixels of the pixel array 110 may be focus pixels for generating AF data. The focus pixels may include a pair of photodiodes.

In an embodiment, each of the plurality of pixels of the pixel array 110 may include a plurality of sub-pixels. Each of the plurality of sub-pixels may include a pair of photodiodes and a pair of transfer transistors connected to the pair of photodiodes, respectively. The pixel array 110 may operate in binning mode or full mode. When operating in binning mode, the pixel array 110 may perform shuttering in global shutter mode, and when operating in full mode, the pixel array 110 may perform shuttering in rolling shutter mode.

In an embodiment, the sub-pixels included in each of the plurality of pixels of the pixel array 110 may be shuttered in rolling shutter mode, and the resulting outputs may be simultaneously output through separate output lines which are connected. The image sensor 1100 may transmit the image data IDTA or signal-processed image data IDTA to the AP 1200. Transmission of the image data IDT may be performed using, for example, a camera serial interface (CSI) based on a mobile industry processor interface (MIPI), but embodiments are not limited thereto.

The AP 1200 may perform image processing, such as bad pixel correction, 3A adjustment (auto-focus correction, auto-white balance, auto-exposure), noise reduction, sharpening, gamma control, re-mosaic, de-mosaic, resolution scaling (video/preview), and the like, on the received image data IDT. In addition, the AP 1200 may generate an image with a high dynamic range by performing high dynamic range (HDR) processing on the plurality of image data IDTA with different luminance.

Referring to FIG. 14B, an electronic device 1000*b* may further include an illuminance sensor 1300. The illuminance sensor 1300 may sense the ambient illuminance of the electronic device 1000*b*, and may transmit information about the ambient illuminance to the AP 1200. The AP 1200 may determine operation mode, shuttering mode, or conversion gain mode of the image sensor 1100 based on the illuminance information. For example, the AP 1200 may determine that the image sensor 1100 operates in global shutter mode if the illuminance is less than a reference value, and may determine that the image sensor 1100 operates in rolling shutter mode if the illuminance is greater than the reference value. For example, the AP 1200 may determine that the image sensor 1100 operates in binning mode if the illuminance is less than the reference value, and may determine that the image sensor 1100 operates in full mode if the illuminance is greater than the reference value. In an embodiment, the sub-pixels included in each of the plurality of pixels of the pixel array 110 included in the image sensor 1100 may be shuttered in rolling shutter mode, and the resulting outputs may be simultaneously output through separate output lines which are connected.

Figure 15:
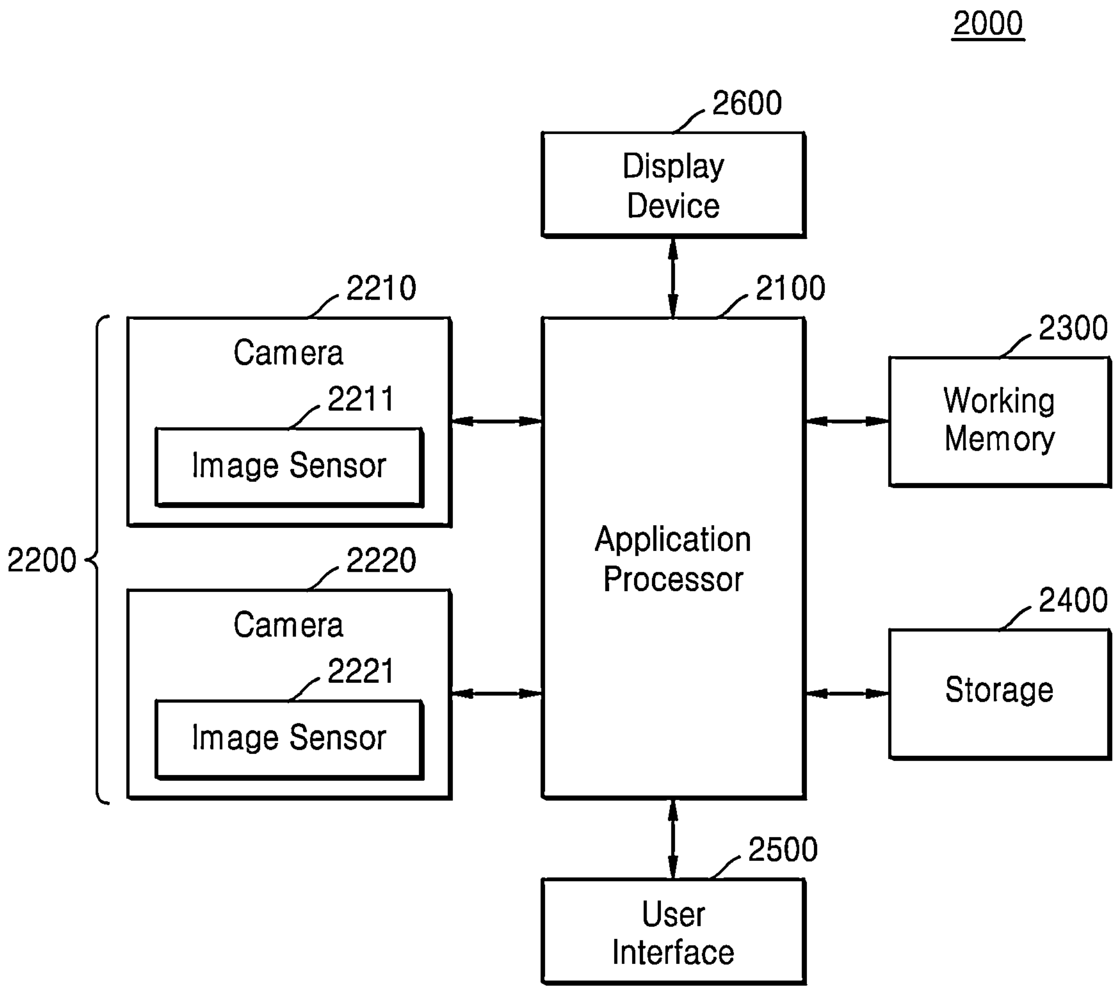
FIG. 15 is a schematic block diagram of an electronic device including image sensors according to an embodiment.

FIG. 15 is a schematic block diagram of an electronic device including image sensors according to an embodiment. An electronic device 2000 of FIG. 15 may be a portable terminal. Referring to FIG. 15, the electronic device 2000 may include an AP 2100, a camera module 2200, a display device 2600, a working memory 2300, a storage 2400, and a user interface 2500. The electronic device 2000 may further include other general-purpose components, such as a communication module, a sensor module, etc.

The AP 2100 may be implemented as a system-on-chip (SoC) that controls the overall operation of the electronic device 2000 and runs an application program, operating system, etc. The AP 2100 may provide image data provided from the camera module 2200 to the display device 2600 or store the image data in the storage 2400. In an embodiment, the AP 2100 may include an image processing circuit, and may perform image processing such as image quality adjustment, data format change, and HDR processing on the image data received from the camera module 2200.

The camera module 2200 may include a plurality of cameras, for example, a first camera 2210 and a second camera 2220. The first camera 2210 and the second camera 2210 may include image sensors 2211 and 2221, respectively. At least one of the first image sensor 2211 and the second image sensor 2221 may be implemented as the image sensor described with reference to FIGS. 1 to 9. At least one of the first image sensor 2211 and the second image sensor 2221 may selectively perform shuttering in rolling shutter mode or global shutter mode. At least one of the first image sensor 2211 and the second image sensor 2221 may operate in binning mode or full mode, and may perform shuttering in global shutter mode when operating in binning mode, and may perform shuttering in rolling shutter mode when operating in a full mode.

In an embodiment, sub-pixels included in each of the plurality of pixels of the pixel array 110 included in at least one of the first image sensor 2211 and the second image sensor 2221 may be shuttered in rolling shutter mode, and the resulting outputs may be simultaneously output through separate output lines which are connected.

The working memory 2300 may be implemented as volatile memory such as DRAM or SRMA, or non-volatile resistive memory such as FeRAM or RRAM, PRAM. The working memory 2300 may store programs and/or data, processed or executed by the AP 2100.

The storage 2400 may be implemented as a non-volatile memory device such as NAND flash or resistive memory. For example, the storage 2400 may be provided as a memory card (MMC, eMMC, SD, micro SD), etc. The storage 2400 may store image data provided from the camera module 2200.

The user interface 2700 may be implemented with various devices capable of receiving user input, such as a keyboard, a curtain key panel, a touch panel, a fingerprint sensor, and a microphone. The user interface 2700 may receive user input, and may provide a signal corresponding to the received user input to the AP 2100.

While the inventive concept has been particularly shown and described with reference to embodiments thereof, it will be understood that various changes in form and details may be made therein without departing from the spirit and scope of the following claims.

What is claimed is:

1. An image sensor, comprising:

a pixel array including a plurality of pixels, wherein each pixel of the plurality of pixels comprises:

a first sub-pixel electrically coupled to a first floating diffusion node of the pixel;

a second sub-pixel electrically coupled to a second floating diffusion node of the pixel;

a first rolling shutter operation circuit configured to read out photocharges integrated in the first floating diffusion node during a rolling shutter mode of operation;

a second rolling shutter operation circuit configured to read out photocharges integrated in the second floating diffusion node during the rolling shutter mode of operation;

a global select switch circuit electrically coupled to the first and second rolling shutter operation circuits; and a global shutter operation circuit electrically coupled to the global select switch circuit, and configured to read out photocharges integrated in the first and second floating diffusion nodes during a global shutter mode of operation.

2. The image sensor of claim 1, wherein the first rolling shutter operation circuit is electrically coupled to a first output line, the second rolling shutter operation circuit is electrically coupled to a second output line, and the global shutter operation circuit is electrically coupled to a third output line.

3. The image sensor of claim 1,
wherein the first rolling shutter operation circuit comprises:
a first source follower transistor configured to amplify and output a voltage of the first floating diffusion node; and
a first rolling select transistor electrically connected in series with the first source follower transistor; and
wherein the second rolling shutter operation circuit comprises:
a second source follower transistor configured to amplify and output a voltage of the second floating diffusion node; and
a second rolling select transistor electrically connected in series with the second source follower transistor.

4. The image sensor of claim 3, wherein the global select switch circuit is electrically connected to a first node within the first rolling shutter operation circuit and a second node within the second rolling shutter operation circuit.

5. The image sensor of claim 4, wherein the first node is a current carrying node shared by the first source follower transistor and the first rolling select transistor; and wherein the second node is a current carrying node shared by the second source follower transistor and the second rolling select transistor.

6. The image sensor of claim 4, wherein the global select switch circuit comprises a transistor having a first current carrying terminal electrically coupled to the first node and a second current carrying terminal electrically coupled to the second node.

7. The image sensor of claim 4, wherein the global select switch circuit comprises:
a first global select switch transistor having a first current carrying terminal electrically connected to the first node; and
a second global select switch transistor having a first current carrying terminal electrically connected to the second node.

8. The image sensor of claim 7, wherein a second current carrying terminal of the first global select switch transistor and a second current carrying terminal of the second global select switch transistor are electrically coupled to the global shutter operation circuit.

9. The image sensor of claim 8, wherein a gate terminal of the first global select switch transistor and a gate terminal of the second global select switch transistor are responsive to a same control signal.

10. The image sensor of claim 8, wherein a gate terminal of the first global select switch transistor and a gate terminal of the second global select switch transistor are responsive to different control signals.

11. The image sensor of claim 1, wherein the global shutter operation circuit comprises:
a precharge circuit electrically coupled to an output terminal of the global select switch circuit; and
a sampling circuit having at least one capacitor therein, electrically coupled to the output terminal of the global select switch circuit.

12. The image sensor of claim 11, wherein the global shutter operation circuit further comprises a capacitor control transistor electrically coupled between the sampling circuit and the precharge circuit.

13. The image sensor of claim 1, wherein the image sensor further comprises:
a first substrate and a second substrate connected in a chip to chip (C2C) structure;
wherein the first sub-pixel, the second sub-pixel, the first rolling shutter operation circuit, and the second rolling shutter operation circuit are formed on the first substrate; and
wherein the global select switch circuit and the global shutter operation circuit are formed on the second substrate.

14. The image sensor of claim 1, wherein the image sensor further comprises:
a first substrate and a second substrate connected in a chip to chip (C2C) structure;
wherein the first sub-pixel, the second sub-pixel, the first rolling shutter operation circuit, the second rolling shutter operation circuit, and the global select switch circuit are formed on the first substrate; and
wherein the global shutter operation circuit is formed on the second substrate.

15. An image sensor, comprising:
a first sub-pixel including at least two first photodiodes;
a second sub-pixel including at least two second photodiodes;
a first floating diffusion node configured to store charge integrated by the first photodiodes;
a second floating diffusion node configured to store charge integrated by the second photodiodes;
a first source follower transistor configured to amplify a voltage stored in the first floating diffusion node;
a second source follower transistor configured to amplify a voltage stored in the second floating diffusion node;
a first rolling select transistor connected in series with the first source follower transistor;
a second rolling select transistor connected in series with the second source follower transistor; and
a global select switch connected between an output terminal of the first source follower transistor and an output terminal of the second source follower transistor.

16. The image sensor of claim 15, wherein the global select switch comprises:
a first global select switch transistor having a first current carrying terminal electrically coupled to the output terminal of the first source follower transistor; and
a second global select switch transistor having a first current carrying terminal electrically coupled to the output terminal of the second source follower transistor.

17. The image sensor of claim 16, wherein a second current carrying terminal of the first global select switch transistor and a second current carrying terminal of the second global select switch transistor are electrically coupled to a global shutter operation circuit, which is configured to read out photocharge integrated in the first floating diffusion node and the second floating diffusion node during a global shutter mode of operation.

18. The image sensor of claim 17,
wherein a current carrying terminal of the first rolling select transistor is electrically coupled to a first output line, and a current carrying terminal of the second rolling select transistor is electrically coupled to a second output line; and
wherein a current carrying terminal of a global select transistor within the global shutter operation circuit is electrically coupled to a third output line.

19. An image processing device, comprising:
an image sensor including a pixel array in which a plurality of pixels are arranged in a matrix, and configured to generate image data based on optical signals received by the pixel array; and an application processor configured to receive and process the image data from the image sensor and provide a mode setting signal to the image sensor;

wherein each of the plurality of pixels comprises:

a first sub-pixel sharing a first floating diffusion node;

a second sub-pixel sharing a second floating diffusion node;

a first rolling shutter operation circuit configured to read out photocharge integrated in the first floating diffusion node during a rolling shutter mode of operation;

a second rolling shutter operation circuit configured to read out photocharge integrated in the second floating diffusion node during the rolling shutter mode of operation;

a global select switch circuit electrically coupled between the first rolling shutter operation circuit and the second rolling shutter operation circuit, and including at least one transistor; and a global shutter operation circuit electrically coupled to the global select switch circuit, and configured to read out photocharge integrated in the first floating diffusion node and the second floating diffusion node during a global shutter mode of operation.

20. The image processing device of claim 19, wherein the pixel array of the image sensor is configured to selectively operate in the global shutter mode of operation or the rolling shutter mode of operation based on a value of the mode setting signal received from the application processor.

* * * * *